(12) United States Patent
Yoon

(10) Patent No.: US 10,720,449 B2
(45) Date of Patent: Jul. 21, 2020

(54) SEMICONDUCTOR AND METHOD OF MANUFACTURING THE SAME

(71) Applicant: Samsung Electronics Co., Ltd., Suwon-si, Gyeonggi-do (KR)

(72) Inventor: Chang Seop Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/113,363

(22) Filed: Aug. 27, 2018

(65) Prior Publication Data

US 2019/0296054 A1    Sep. 26, 2019

(30) Foreign Application Priority Data

Mar. 20, 2018  (KR) .......................... 10-2018-0031804

(51) Int. Cl.
| H01L 27/12 | (2006.01) |
| H01L 29/06 | (2006.01) |
| H01L 21/84 | (2006.01) |
| H01L 29/08 | (2006.01) |
| H01L 27/11 | (2006.01) |
| H01L 27/092 | (2006.01) |

(52) U.S. Cl.
CPC ........ *H01L 27/1211* (2013.01); *H01L 21/845* (2013.01); *H01L 29/0649* (2013.01); *H01L 29/0847* (2013.01); H01L 27/0924 (2013.01); H01L 27/1104 (2013.01)

(58) Field of Classification Search
CPC ............. H01L 27/1211; H01L 27/1104; H01L 27/0924; H01L 29/0847; H01L 29/0649; H01L 21/845
See application file for complete search history.

(56) References Cited

U.S. PATENT DOCUMENTS

| 7,388,258 | B2 | 6/2008 | Zhang et al. |
| 7,659,153 | B2 | 2/2010 | Zhang et al. |
| 8,859,389 | B2 | 10/2014 | Kawasaki et al. |
| 9,583,598 | B2 | 2/2017 | Lee et al. |
| 9,590,077 | B2 | 3/2017 | Cheng et al. |
| 9,679,763 | B1 | 6/2017 | Cheng et al. |

(Continued)

OTHER PUBLICATIONS

Hook, Terence B. "Fully Depleted Devices for Designers: FDSOI and Finfets." Custom Integrated Circuits Conference (CICC), 2012 IEEE, San Jose, CA, Sep. 9-12, 2012.

*Primary Examiner* — Sitaramarao S Yechuri

(74) *Attorney, Agent, or Firm* — Harness, Dickey & Pierce, P.L.C.

(57) ABSTRACT

A semiconductor device includes a substrate including a lower substrate layer, a buried insulation layer on the lower substrate layer, and an upper substrate layer on the buried insulation layer, a first trench passing through the upper substrate layer, the buried insulation layer, and a portion of the lower substrate layer, a second trench passing through the upper substrate layer, the buried insulation layer, and a portion of the lower substrate layer and being spaced apart from the first trench, a field insulation layer in a portion of the first trench and in a portion of the second trench, and a first fin pattern defined by the first trench and the second trench. An upper surface of the field insulation layer is higher than an upper surface of the buried insulation layer.

19 Claims, 40 Drawing Sheets

(56) References Cited

U.S. PATENT DOCUMENTS

| | | | |
|---|---|---|---|
| 9,704,883 B2 | 7/2017 | Wang et al. | |
| 2005/0179073 A1* | 8/2005 | Lee | H01L 21/823425 257/296 |
| 2005/0224880 A1* | 10/2005 | Lee | H01L 29/42392 257/347 |
| 2007/0040221 A1* | 2/2007 | Gossner | H01L 27/0288 257/355 |
| 2007/0181947 A1* | 8/2007 | Ching Ho Chan | H01L 21/845 257/351 |
| 2007/0259501 A1* | 11/2007 | Xiong | H01L 21/845 438/283 |
| 2016/0005813 A1 | 1/2016 | Kim | |
| 2016/0365362 A1* | 12/2016 | Wang | H01L 29/0649 |
| 2016/0380000 A1* | 12/2016 | Hashemi | H01L 21/82382 257/351 |
| 2017/0117187 A1 | 4/2017 | Ando et al. | |
| 2019/0006506 A1* | 1/2019 | Greene | H01L 29/66545 |
| 2019/0148516 A1* | 5/2019 | Zhang | H01L 29/66666 257/329 |

* cited by examiner

SEMICONDUCTOR AND METHOD OF MANUFACTURING THE SAME

CROSS-REFERENCE TO RELATED APPLICATION

This application claims priority under 35 U.S.C. § 119 to Korean Patent Application No. 10-2018-0031804, filed on Mar. 20, 2018, in the Korean Intellectual Property Office, the disclosure of which is hereby incorporated by reference in its entirety.

Technical Field

Example embodiments of the present disclosure relate to a semiconductor device and a method of manufacturing the same.

Discussion of Related Art

A semiconductor device is miniaturized. Thus, a small structural difference in transistors included in the semiconductor device may affect to the performance of the semiconductor device. To meet the high performance of the semiconductor device, a silicon on insulator (SOI) substrate may be used.

SUMMARY

According to example embodiments of the inventive concepts, a semiconductor device may include a substrate including a lower substrate layer, a buried insulation layer on the lower substrate layer, and an upper substrate layer on the buried insulation layer, wherein the substrate has a first trench passing through the upper substrate layer, the buried insulation layer, and a portion of the lower substrate layer, a second trench passing through the upper substrate layer, the buried insulation layer, and a portion of the lower substrate layer and spaced apart from the first trench, and a first fin pattern defined by the first trench and the second trench, and a field insulation layer in a portion of the first trench and in a portion of the second trench. An upper surface of the field insulation layer may be higher than an upper surface of the buried insulation layer.

According to example embodiments of the inventive concepts, a semiconductor device may include a base semiconductor layer, a first fin pattern protruding upward from the base semiconductor layer and including a first lower substrate pattern, a first buried insulation pattern, and a first upper substrate pattern that are sequentially stacked, wherein the first lower substrate pattern includes a same material as the base semiconductor layer, a field insulation layer on the base semiconductor layer and covering a sidewall of the first lower substrate pattern, a sidewall of the first buried insulation pattern, and a sidewall of a lower portion of the first upper substrate pattern, and a first epitaxial pattern filling a trench in the first upper substrate pattern.

According to example embodiments of the inventive concepts, a semiconductor device may include a lower substrate layer, a buried insulation layer on the lower substrate layer, a first fin pattern including a first sub fin pattern and a second fin pattern that protrude from the buried insulation layer and including a first connection pattern connecting the first sub fin pattern and the second fin pattern, and a field insulation layer covering the first connection pattern and a sidewall of a portion of each of the first subs fin pattern and the second fin pattern.

According to example embodiments of the inventive concepts, a method of manufacturing a semiconductor device may include providing a substrate including a lower substrate layer, a buried insulation layer, and an upper substrate layer that are sequentially stacked, patterning the substrate to form a base semiconductor layer and a first fin pattern protruding from the base semiconductor layer, wherein the first fin pattern includes a first lower substrate pattern, a first buried insulation pattern, and a first upper substrate pattern that are sequentially stacked on the base semiconductor layer, forming a field insulation layer covering a portion of a sidewall of the first fin pattern, wherein an upper surface of the field insulation layer is higher than an upper surface of the first buried insulation pattern.

DETAILED DESCRIPTION

Figure 1:
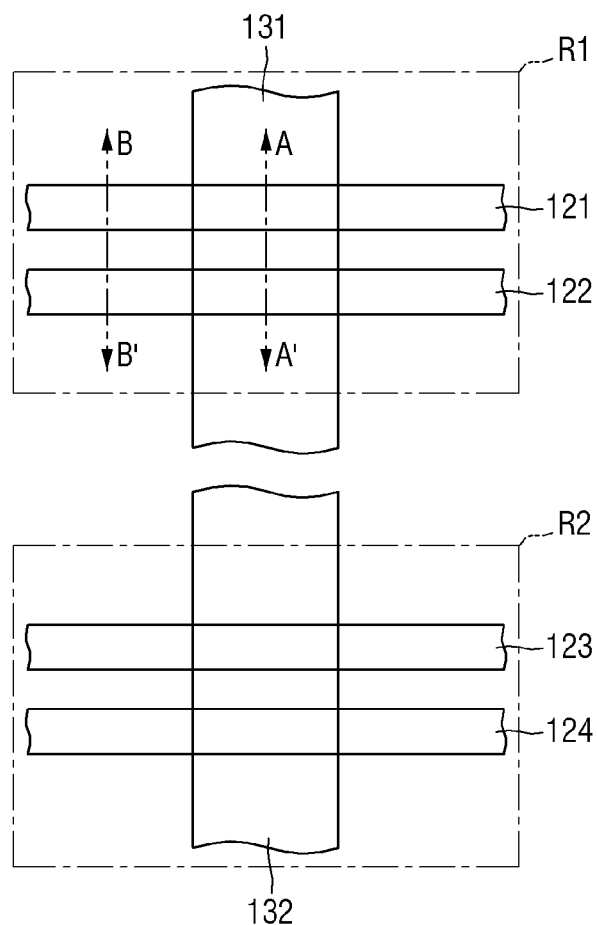
FIGS. 1, 6, 10, 14, 18, 22, 25, 29, and 33 are layout diagrams, respectively, of a semiconductor devices according to example embodiments.

Various example embodiments will now be described more fully hereinafter with reference to the accompanying drawings. Like reference numerals may refer to like elements throughout this application.

FIG. 1 is a layout diagram of a semiconductor devices according to example embodiments.

Referring to FIG. 1, a substrate (see, e.g., 100 of FIG. 2) of the semiconductor device according to example embodiments includes a first region R1 and a second region R2. The first region R1 and the second region R2 may be spaced apart from or be connected to each other. The first region R1 and the second region R2 may be included in a same functional region, e.g., a logic region or an input/output (I/O). The first region R1 and the second region R2 may be regions in which transistors of different conductivity types are formed. In some embodiments, when an NMOS transistor is formed in the first region R1, a PMOS transistor may be formed in the second region RE Alternatively, when a PMOS transistor is formed in the first region R1, an NMOS transistor may be formed in the second region R1.

A first fin pattern 121 and a second fin pattern 122 are disposed in the first region R1. A first gate structure 131 traverse the first and second fin patterns 121 and 122 and extends in a direction crossing an extension direction of the first and second fin patterns 121 and 122. A third fin pattern 123 and a fourth fin pattern 124 are disposed in the second region R1. A second gate structure 132 traverses the third and fourth fin patterns 123 and 124 and extends in a direction crossing an extension direction of the third and fourth fin patterns 123 and 124. In some embodiments, the first gate structure 131 and the second gate structure 132 may be connected to each other to form one gate structure.

The first and second fin patterns 121 and 122 may have substantially the same shape as the third and fourth fin patterns 123 and 124. Therefore, hereinafter, descriptions of the first and second fin patterns 121 and 122 will be mainly produced. The descriptions of the first and second fin patterns 121 and 122 may also be applied to the third and fourth fin patterns 123 and 124.

Figure 2:
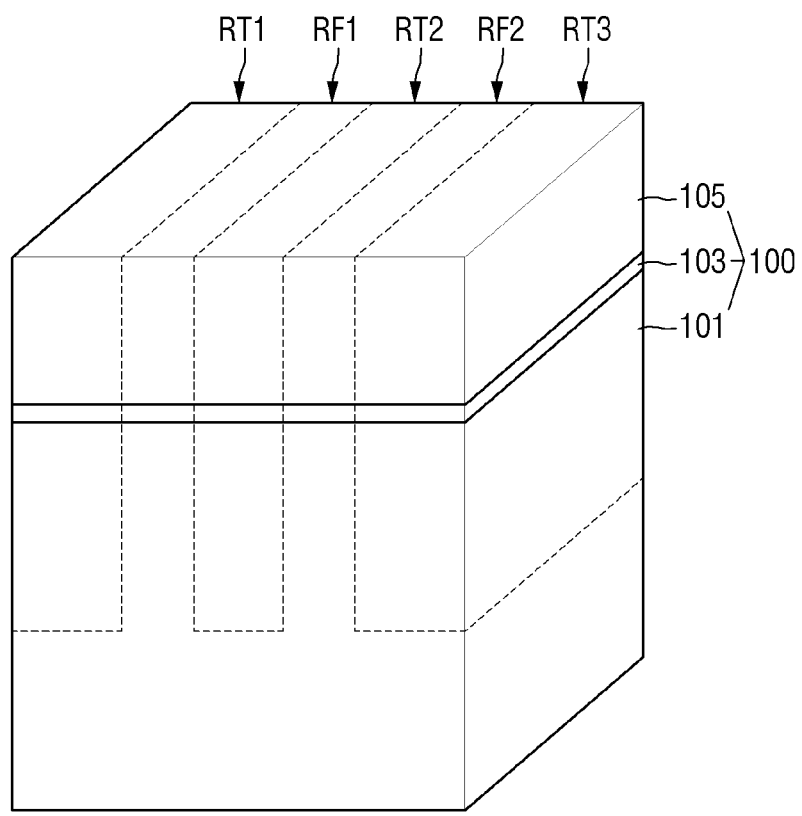
FIG. 2 is a perspective view of a semiconductor device according to example embodiments.
Figure 3:
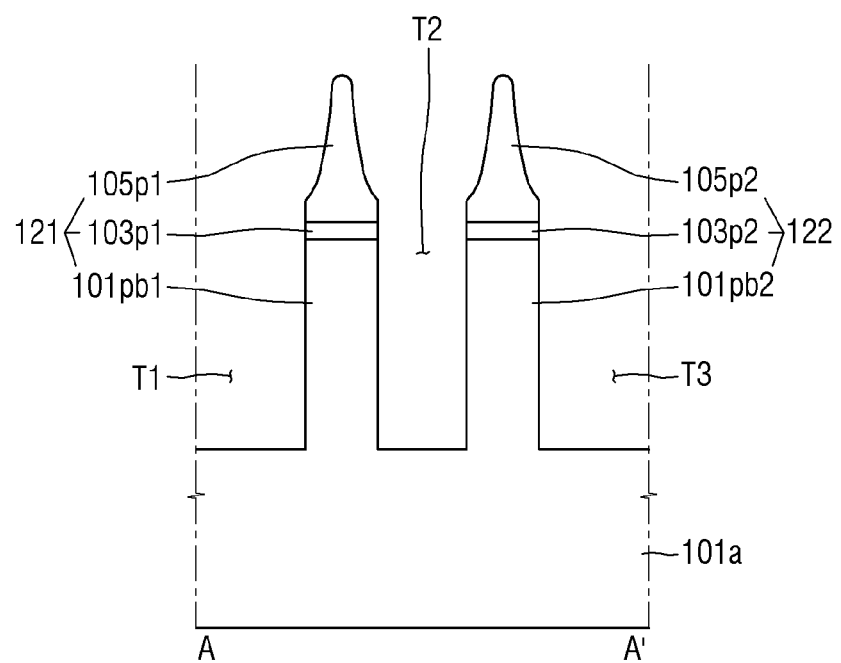
FIGS. 3, 4, 5, 7, 8, 9, 11, 12, 13, 15, 16, 17, 19, 20, 21, 23, 24, 26, 27, 28, 30, 31, 32, 34, and 35 are cross-sectional views, respectively, of a semiconductor device according to example embodiments.

FIG. 2 is a perspective view of a semiconductor device according to example embodiments. FIG. 3 is a cross-sectional view taken along line A-A' of FIG. 1. In FIG. 3, a field insulation layer 140 and a first gate structure 131 are not illustrated for convenience.

Referring to FIGS. 2 and 3, the substrate 100 includes a lower substrate layer 101, a buried insulation layer 103, and an upper substrate layer 105 that are sequentially stacked. The substrate 100 may be a silicon on insulator (SOI) substrate. The buried insulation layer 103 may be a buried oxide layer of the SOI substrate.

The substrate 100 includes a first trench forming region RT1, a second trench forming region RT2, and a third trench forming region RT3. The first to third trench forming regions RT1, RT2, and RT3 may be spaced apart from one another. The substrate 100 further includes a first fin forming region RF1 between the first trench forming region RT1 and the second trench forming region RT2 and a second fin forming region RF2 between the second trench forming region RT2 and the third trench forming region RT3. The first trench forming region RT1 may be a region in which a first trench T1 is formed. The second trench forming region RT2 may be a region in which a second trench T2 is formed. The third trench forming region RT3 may be a region in which a third trench T3 is formed. The first fin pattern 121 and the second fin pattern 122 may be formed in the first fin forming region RF1 and the second fin forming region RF2, respectively.

The first to third trenches T1, T2, and T3 are formed spaced apart from one another in the substrate 100. The first fin pattern 121 may be defined by the first trench T1 and the second trench T2. The second fin pattern 122 may be defined by the second trench T2 and the third trench T3. The first and second fin patterns 121 and 122 may be formed using the substrate 100 that is the SOI substrate. The first to third trenches T1, T2, and T3 are formed in a portion of the lower substrate layer 101, the buried insulation layer 103, and the upper substrate layer 105 (or the first to third trenches T1, T2, and T3 passes through the upper substrate layer 105, the buried insulation layer 103, and a portion of the lower substrate layer 101). A bottom surface of each of the first to third trenches T1, T2, and T3 may be defined by a base semiconductor layer 101a that is a remaining portion of the lower substrate layer 101. Each of the first and second fin patterns 121 and 122 protrudes upward from the base semiconductor layer 101a. The first fin pattern 121 includes a first lower substrate pattern 101pb1, a first buried insulation pattern 103p1, and a first upper substrate pattern 105p1. The second fin pattern 122 includes a second lower substrate pattern 101pb2, a second buried insulation pattern 103p2, and a second upper substrate pattern 105p2.

Each of the first and second lower substrate patterns 101pb1 and 101pb2 may be a portion of the lower substrate layer 101 between the first trench T1 and the second trench T2. The lower substrate layer 101 includes the base semiconductor layer 101a and the first and second lower substrate patterns 101pb1 and 101pb2. That is, the first and second lower substrate patterns 101pb1 and 101pb2 may include the same material as the base semiconductor layer 101a. Each of the first and second lower substrate patterns 101pb1 and 101pb2 may protrude upward from the base semiconductor layer 101a and may define a portion of a sidewall of each of the first and second trenches T1 and T2. Each of the first and second buried insulation patterns 103p1 and 103p2 may include an oxide of one of a material included in the lower substrate layer 101 and a material included in the upper substrate layer 105. Each of the first and second upper substrate patterns 105p1 and 105p2 may be a portion of the upper substrate layer 105 between the first trench T1 and the second trench T2. The first and second upper substrate patterns 105p1 and 105p2 may have, e.g., a shape tapering in an upward direction, but are not limited thereto. For example, a lower width and an upper width of each of the first and second upper substrate patterns 105p1 and 105p2 may be substantially the same.

In the drawing, it is illustrated that a sidewall of each of the first and second lower substrate patterns 101pb1 and 101pb2 and a sidewall of each of the first and second buried insulation patterns 103p1 and 103p2 are vertical to an upper surface of the base semiconductor layer 101a. However, the example embodiments are not limited thereto. For example, the sidewall of each of the first and second lower substrate patterns 101pb1 and 101pb2 and the sidewall of each of the first and second buried insulation patterns 103p1 and 103p2 may be sloped at any angle with respect to the upper surface of the base semiconductor layer 101a. In other words, at least a portion of each of the first to third trenches T1, T2, and T2 may be sloped at any angle with respect to the upper surface of the base semiconductor layer 101a. A region, in which the sidewall of each of the first and second lower substrate patterns 101pb1 and 101pb2 and the upper surface of the base semiconductor layer 101a meet, have a chamfered shape, unlike that shown in the drawing.

Figure 4:
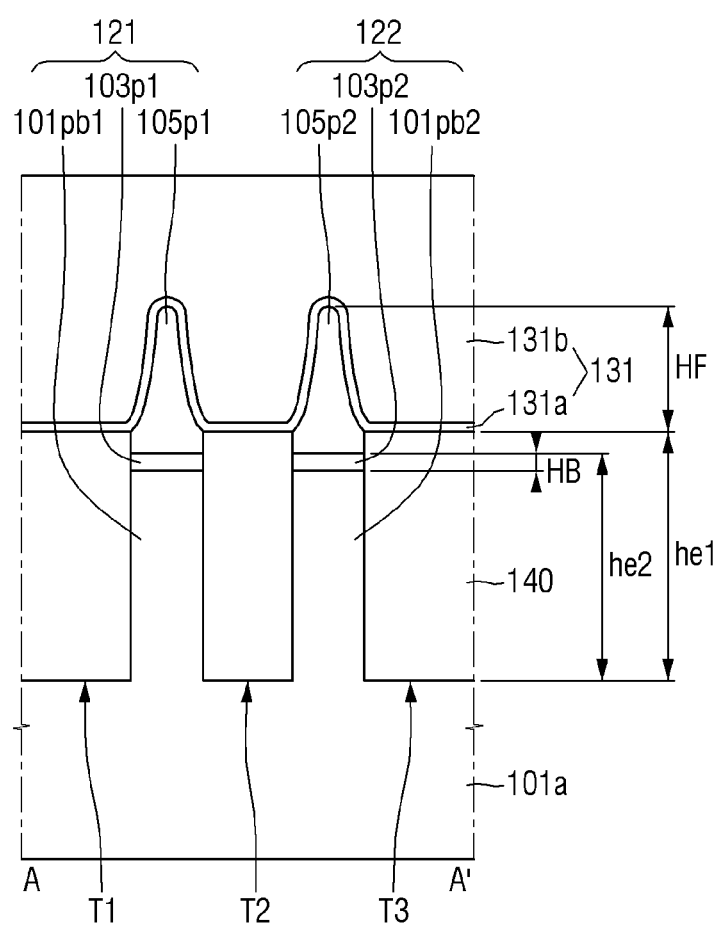

FIG. 4 is a cross-sectional view taken along line A-A' of FIG. 1.

Referring to FIG. 4, the field insulation layer 140 is disposed on the base semiconductor layer 101a to fill a portion of each of the first to third trenches T1, T2, and T3. For example, the field insulation layer 140 may cover sidewalls of lower portions of the first and second upper substrate patterns 105p1 and 105p2, sidewalls of the first and second buried insulation patterns 103p1 and 103p2, and sidewalls of the first and second lower substrate patterns 101pb1 and 101pb2. Each of the first and second upper substrate patterns 105p1 and 105p2 may include a first portion covered by the field insulation layer 140 and a second portion protruding above the field insulation layer 140.

In some embodiments, a height HF of the second portion of each of the first and second upper substrate patterns 105p1 and 105p2 may be greater than twice a thickness HB of each of the first and second buried insulation patterns 103p1 and 103p2. For example, the height HF from an upper surface of the field insulation layer 140 to an upper surface of each of the first and second upper substrate patterns 105p1 and 105p2 may be greater than twice the thickness HB of each of the first and second buried insulation patterns 103p1 and 103p2.

The upper surface of the field insulation layer 140 may be positioned at a first height he1 from an upper surface of the base semiconductor layer 101a. An upper surface of each of the first and second buried insulation patterns 103p1 and 103p2 may be positioned at a second height he2 from the upper surface of the base semiconductor layer 101a. The first height he1 may be greater than the second height he2. For example, the buried insulation layer 103 may be located below the upper surface of the field insulation layer 140. The field insulation layer 140 may include, e.g., oxide.

The first gate structure 131 is disposed on the first and second fin patterns 121 and 122 and the field insulation layer 140. The first gate structure 131 includes a first gate insulation layer 131a and a first gate electrode 131b. The first gate insulation layer 131a may extend along a profile of the second portion of each of the first and second upper substrate patterns 105p1 and 105p2 and along the upper surface of the field insulation layer 140.

The first gate electrode 131b is disposed on the first gate insulation layer 131a. In the drawing, the first gate electrode 131b is illustrated as a single layer, but it is not limited thereto. For example, the first gate electrode 131b may include a multiple layers.

Figure 5:
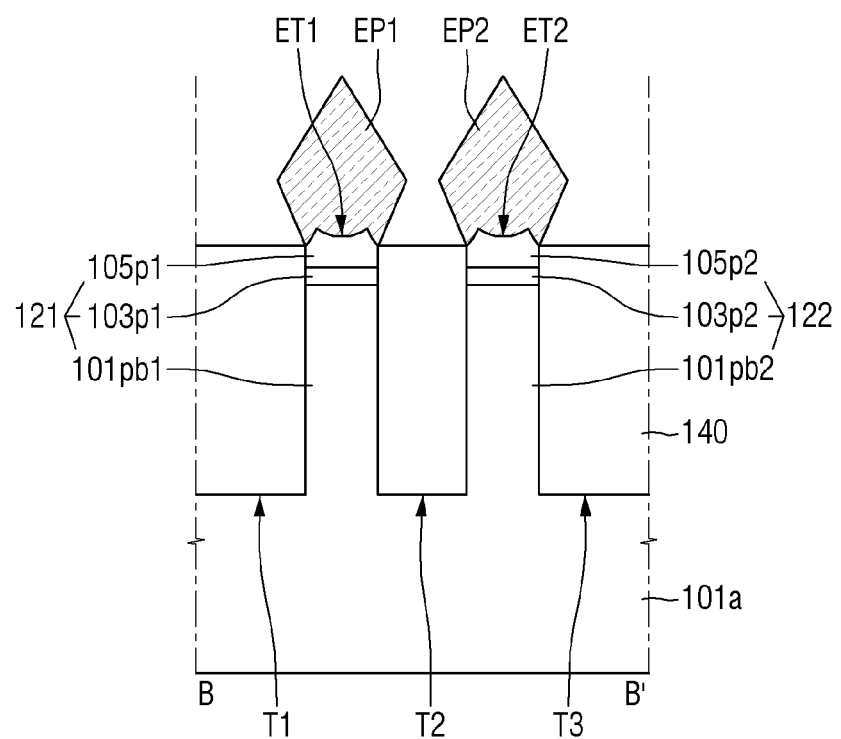

FIG. 5 is a cross-sectional view taken along line B-B' of FIG. 1.

Referring to FIG. 5, the first upper substrate pattern 105p1 includes a first epi trench ET1, and the second upper substrate pattern 105p2 includes a second epi trench ET2. The first epi trench ET1 and the second epi trench ET2 may be formed in the first upper substrate pattern 105p1 and the second upper substrate pattern 105p2, respectively. A bottom surface of the first epi trench ET1 may be defined by the first upper substrate pattern 105p1, and a bottom surface of the second epi trench ET2 may be defined by the second upper substrate pattern 105p2. Heights of the first and second upper substrate patterns 105p1 and 105p2 may respectively be lowered by the first and second epi trenches ET1 and ET2.

In the drawing, the bottom surface of each of the first and second epi trenches ET1 and ET2 is illustrated to be higher than the upper surface of the field insulation layer 140, but is not limited thereto. For example, the bottom surface of each of the first and second epi trenches ET1 and ET2 may be coplanar with or be lower than the upper surface of the field insulation layer 140.

A first epitaxial pattern EP1 may fill the first epi trench ET1, and a second epitaxial pattern EP2 may fill the second epi trench ET2. The first upper substrate pattern 105p1 may be interposed between the first epitaxial pattern EP1 and the first buried insulation pattern 103p1, and the second upper substrate pattern 105p2 may be interposed between the second epitaxial pattern EP2 and the second buried insulation pattern 103p2. The first epitaxial pattern EP1 and the second epitaxial pattern EP2 may be epitaxially grown using the first upper substrate pattern 105p1 and the second upper substrate pattern 105p2, respectively, as a seed. Each of the first and second epitaxial patterns EP1 and EP2 may be doped with impurities by an ion implantation process and may serve as a source or drain.

Since the semiconductor device according to the example embodiments includes the first and second fin patterns 121 and 122 formed by patterning the SOI substrate (e.g., the substrate 100 of FIG. 2), leakage currents may be reduced or prevented from flowing into the base semiconductor layer 101a in the semiconductor device and the short channel effect in which a potential of a channel region of the transistor is affected by a drain voltage may also effectively suppressed. Thus, the reliability of the semiconductor device may be improved.

Figure 6:
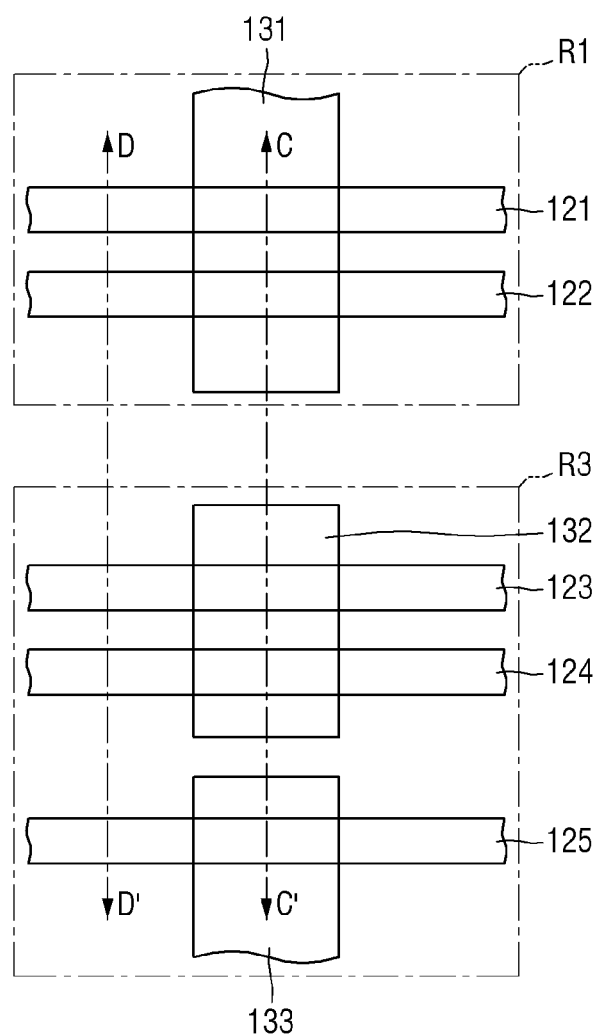

FIG. 6 is a layout diagram of a semiconductor device according to example embodiments.

Referring to FIG. 6, the substrate (see, e.g., 100 of FIG. 2) of the semiconductor device according to example embodiments includes the first region R1 and a third region R3. The first region R1 and the third region R3 may be spaced apart from or connected to each other. The first and third regions R1 and R3 may be included in a same functional region, e.g., a logic region or an input/output I/O region. In some embodiment, the first and third regions R1 and R3 may be included in different functional regions, e.g., different regions among an SRAM region, an input/output (I/O) region, and/or a logic region.

The third fin pattern 123, the fourth fin pattern 124, and a fifth fin pattern 125 are disposed in the third region R3. The second gate structure 132 traverses the third and fourth fin patterns 123 and 124 and extends in a direction crossing an extension direction of the third and fourth fin patterns 123 and 124. A third gate structure 133 traverses the fifth fin pattern 125 and extends in a direction crossing the extension direction of the fifth fin pattern 125. In some embodiments, the second gate structure 132 and the third gate structure 133 may be connected to each other to form one gate structure. In some embodiments, a conductivity type of a transistor including the third and fourth fin patterns 123 and 124 and the second gate structure 132 may be the same or different from a conductivity type of a transistor including the fifth fin pattern 125 and the third gate structure 133.

The fifth fin pattern 125 may have substantially the same shape as the first and second fin patterns 121 and 122. The above descriptions of the first and second fin patterns 121 and 122 will be also applied to the fifth fin pattern 125.

Figure 7:
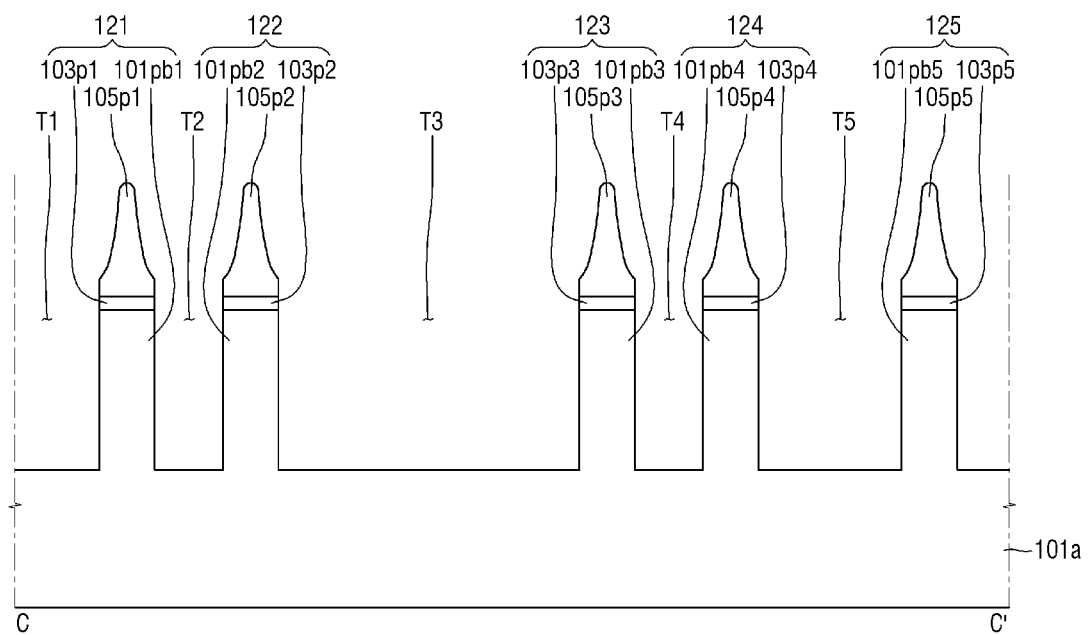

FIG. 7 is a cross-sectional view taken along line C-C' of FIG. 6. In FIG. 6, the field insulation layer 140 and the first and second gate structures 131 and 132 are not illustrated for convenience.

Referring to FIG. 7, the first trench T1, the second trench T2, the third trench T3, a fourth trench R4, and a fifth trench R5 that are spaced apart from one another are formed in the substrate (see, e.g., 100 of FIG. 2). The third fin pattern 123 may be defined by the third trench T3 and the fourth trench T4. The fourth fin pattern 124 may be defined by the fourth trench T4 and the fifth trench T5. The fifth fin pattern 125 may be defined by the fifth trench T5.

The fourth and fifth trenches T4 and T5 are formed in a portion of the lower substrate layer (see, e.g., 101 of FIG. 2), the buried insulation layer (see, e.g., 103 of FIG. 2), and the upper substrate layer (see, e.g., 105 of FIG. 2) (or the fourth and fifth trenches T4 and T5 pass through the upper substrate layer (see, e.g., 105 of FIG. 2), the buried insulation layer 103 (see, e.g., 103 of FIG. 2), and a portion of the lower substrate layer (see, e.g., 101 of FIG. 2)). A bottom surface of each of the fourth and fifth trenches T4 and T5 may be defined by the base semiconductor layer 101a. The third, fourth, and fifth fin patterns 123, 124, and 125 protrude upward from the base semiconductor layer 101a. The third fin pattern 123 includes a third lower substrate pattern 101pb3, a third buried insulation pattern 103p3, and a third upper substrate pattern 105p3 that are sequentially stacked. The fourth fin pattern 124 includes a fourth lower substrate pattern 101pb4, a fourth buried insulation pattern 103p4, and a fourth upper substrate pattern 105p4 that are sequentially stacked. The fifth fin pattern 125 includes a fifth lower substrate pattern 101pb5, a fifth buried insulation pattern 103p5, and a fifth upper substrate pattern 105p5 that are sequentially stacked.

Figure 8:
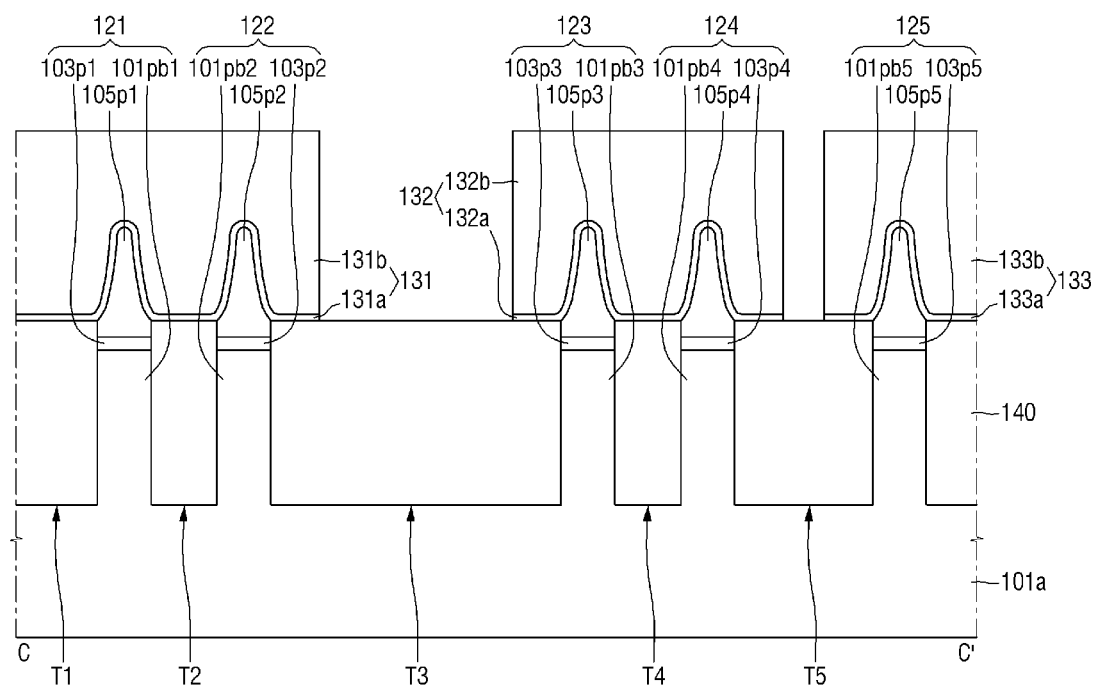

FIG. 8 is a cross-sectional view taken along line C-C' of FIG. 6.

Referring to FIG. 8, the field insulation layer 140 fills a portion of each of the fourth and fifth trenches T4 and T5. The second gate structure 132 includes a second gate insulation layer 132a and a second gate electrode 132b. The third gate structure 133 includes a third gate insulation layer 133a and a third gate electrode 133b. The above descriptions of the first gate structure 131 are applied to the second and third gate structures 132 and 133. The second gate structure 132 may be spaced apart from the first gate structure 131, on the field insulation layer 140 filling the third trench T3. The third gate structure 133 may be spaced apart from the second gate structure 132, on the field insulation layer 140 filling the fifth trench T5.

Figure 9:
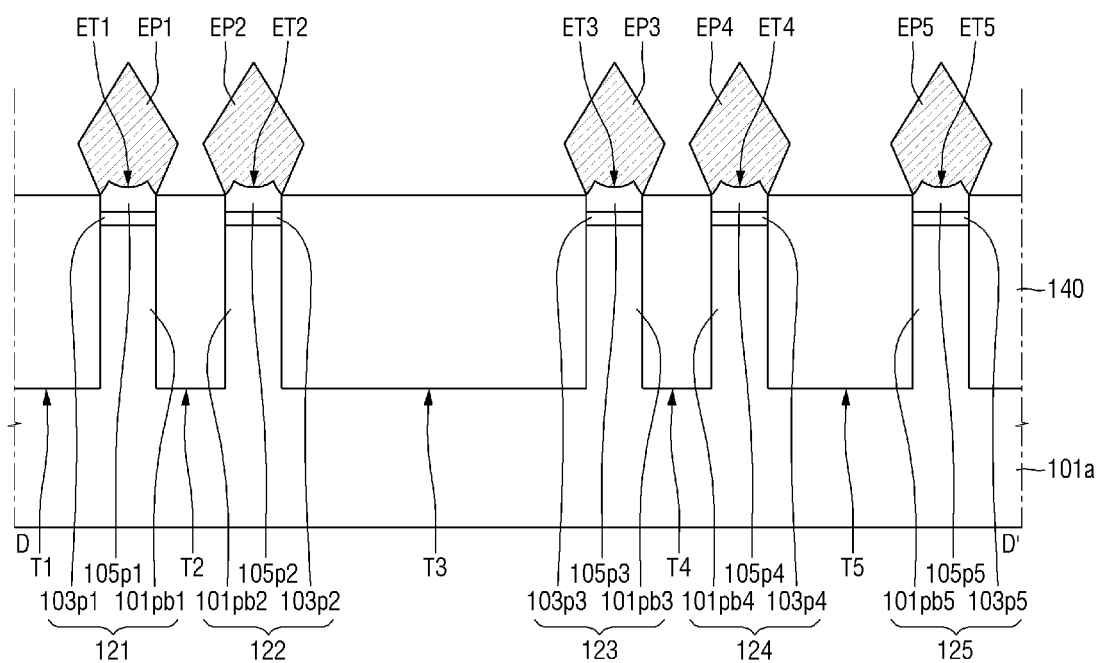

FIG. 9 is a cross-sectional view taken along line D-D' of FIG. 6.

Referring to FIG. 9, the third upper substrate pattern 105p3, the fourth upper substrate pattern 105p4, and the fifth upper substrate pattern 105p5 include a third epi trench ET3, a fourth epi trench ET4, and a fifth epi trench ET5, respectively. The above descriptions of the first and second epi trenches ET1 and ET2 may be applied to the third to fifth epi trenches ET3, ET4, and ET5.

A third epitaxial pattern EP3, a fourth epitaxial pattern EP4, and a fifth epitaxial pattern EP5 fill the third epi trench ET3, the fourth epi trench ET4, and the fifth epi trench ET5, respectively. The above descriptions of the first and second epitaxial patterns EP1 and EP2 may be applied to the third to fifth epitaxial patterns EP3, EP4, and EP5. In some embodiments, when a conductivity type of a transistor including the third and fourth fin patterns 123 and 124 and the second gate structure 132 is different from a conductivity type of a transistor including the fifth fin pattern 125 and the third gate structure 133, a shape of the third and fourth epitaxial patterns EP3 and EP4 may be different from a shape of the fifth epitaxial pattern EP5, unlike those shown in the drawing.

Figure 10:
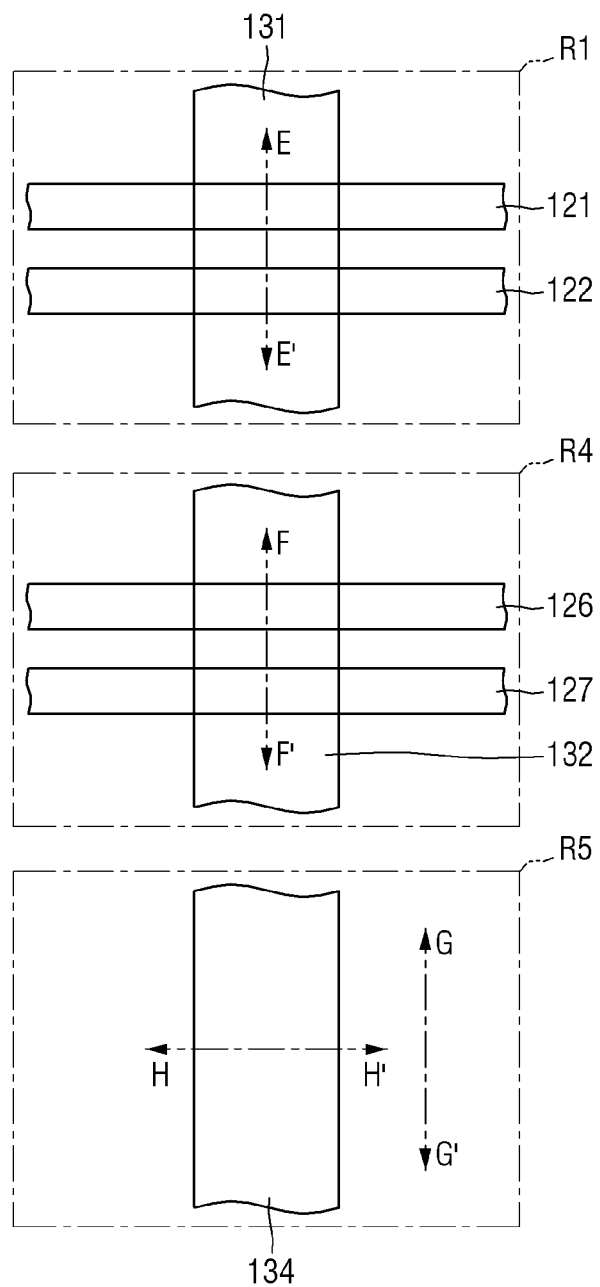

FIG. 10 is a layout diagram of a semiconductor device according to example embodiments.

Referring to FIG. 10, the substrate (see, e.g., 100 of FIG. 2) of a semiconductor device according to example embodiments includes the first region, R1, a fourth region R4, and a fifth region R5. The first region R1, the fourth region R4, and the fifth region R5 may be spaced apart from or connected to one another. The first, fourth, and fifth regions R1, R4, and R5 may be included in a same functional region, e.g., a logic region or an input/output I/O region. In some embodiment, the first, fourth, and fifth regions R1, R4, and R5 may be included in different functional regions, e.g., different regions among a logic region, an SRAM region, and an input/output (I/O) region.

A sixth fin pattern 126 and a seventh fin pattern 127 are disposed in the fourth region R4. The sixth and seventh fin patterns 126 and 127 may share the second gate structure 132. The second gate structure 132 traverses the sixth and seventh fin patterns 126 and 127 and extends in a direction crossing an extension direction of the sixth and seventh fin patterns 126 and 127.

The fifth region R5 may not include a fin pattern. The fourth gate structure 134 is disposed in the fifth region R5. The fifth region R5 may be a region in which a planar transistor is formed.

Figure 11:
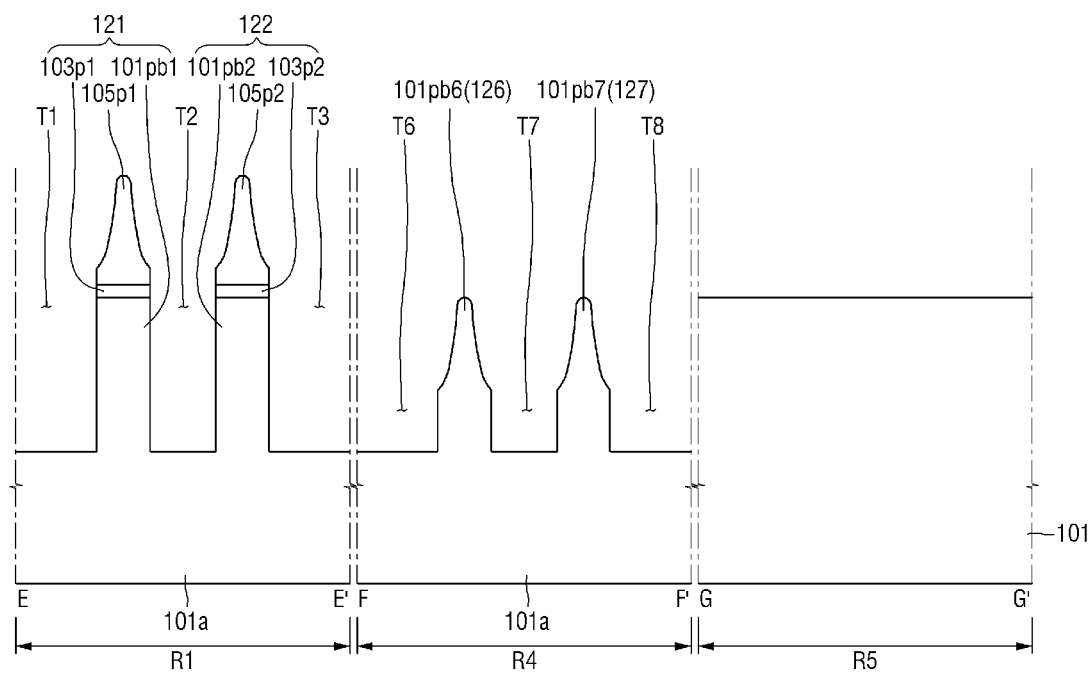

FIG. 11 is a cross-sectional view taken along lines E-E', F-F', and G-G' of FIG. 10. In FIG. 11, the field insulation layer 140 and the first and second gate structures 131 and 132 are not illustrated for convenience.

Referring to FIG. 11, each of the fourth and fifth regions R4 and R5 includes only the lower substrate layer 101 and does not include the buried insulation layer (see, e.g., 103 of FIG. 2) and the upper substrate layer (see, e.g., 105 of FIG. 2). Upper surfaces of the sixth and seventh fin patterns 126 and 127 may be positioned at a lower level than the upper surfaces of the first and second fin patterns 121 and 122. A sixth trench T6, a seventh trench T7, and an eighth trench T8 are formed in the fourth region R4 and are spaced apart from one another. The sixth fin pattern 126 may be defined by the sixth trench T6 and the seventh trench T7. The seventh fin pattern 127 may be defined by the seventh trench T7 and the eighth trench T8. The sixth to eighth trenches T6, T7, and T8 are formed in a portion of the lower substrate layer 101. Bottom surfaces of the sixth to eighth trenches T6, T7, and T8 may be defined by the base semiconductor layer 101a.

Each of the sixth and seventh fin patterns 126 and 127 protrudes upward from the base semiconductor layer 101a. The sixth fin pattern 126 and the seventh fin pattern 127 include only a sixth lower substrate pattern 101pb6 and only a seventh lower substrate pattern 101pb7, respectively. The sixth lower substrate pattern 101pb6 may be a portion of the lower substrate layer 101 between the sixth trench T6 and the seventh trench T7. The seventh lower substrate pattern 101pb7 may be a portion of the lower substrate layer 101 between the seventh trench T7 and the eighth trench T8. In some embodiments, the first region R1 and the fourth region R4 may be connected to each other. When the first and fourth regions R1 and R4 are a connected region, the third and sixth trenches T3 and T6 may separate the first region R1 and the fourth region R4.

Figure 12:
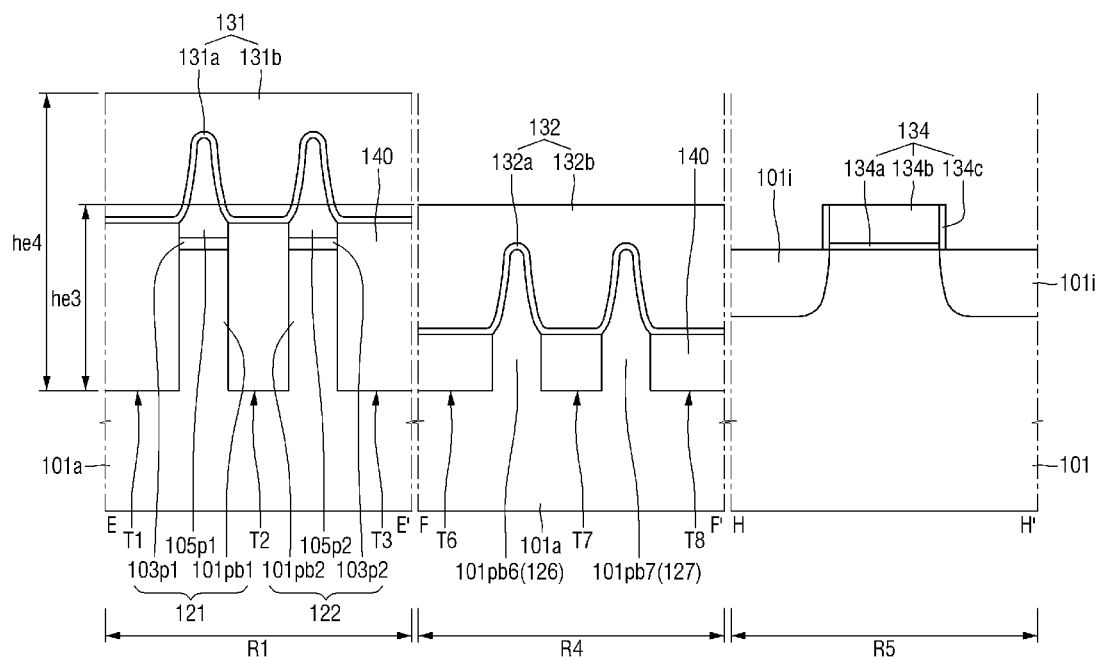

FIG. 12 is a cross-sectional view taken along lines E-E', F-F', and H-H' of FIG. 10.

Referring to FIG. 12, the field insulation layer 140 fills a portion of each of the sixth to eighth trenches T6, T7, and T8. A height of an upper surface of the field insulation layer 140 in the first region R1 may be greater than a height of an upper surface of the field insulation layer 140 in the fourth region R4. A height he4 of an upper surface of the first gate structure 131 in the first region R1 may be greater than a height he3 of an upper surface of the second gate structure 132 in the fourth region R4, with respect to the upper surface of the base semiconductor layer 101a.

The lower substrate layer 101 in the fifth region R5 includes an impurity region 101i therein. The impurity region 101i may be a source or a drain of a transistor formed in the fifth region R5.

The fourth gate structure 134 includes a fourth gate electrode 134b and a fourth gate insulation layer 134a between the fourth gate electrode 134b and the lower substrate layer 101. The fourth gate insulation layer 134a may be, e.g., a high-k dielectric layer. A gate spacer 133c is disposed on at least a sidewall of the fourth gate structure 134. The fourth gate insulation layer 134a may not extend between the gate spacer 133c and the sidewall of the fourth gate electrode 134b. In the drawing, lower surfaces of the first, second, sixth, and seven fin patterns 121, 122, 126, and 127 are illustrated to be coplanar with one another, but are not limited thereto.

Figure 13:
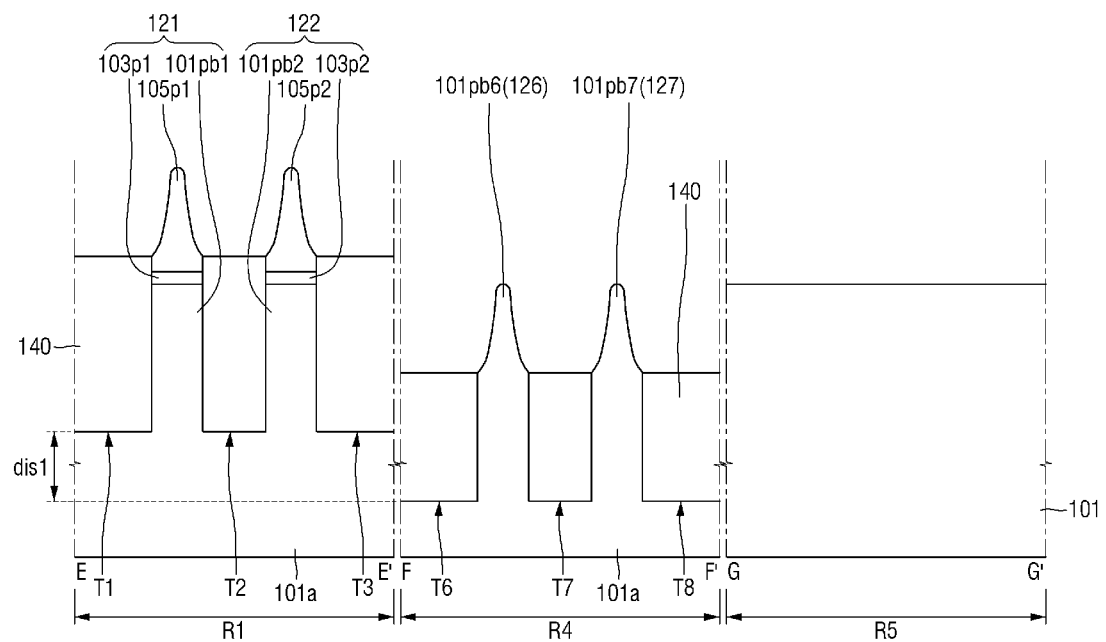

FIG. 13 is a cross-sectional view taken along lines E-E', F-F', and G-G'.

Referring to FIG. 13, the lower surfaces of the first and second fin patterns 121 and 122 are positioned at a distance dis1 above the lower surfaces of the sixth and seventh fin patterns 126 and 127, with respect to the upper surface of the base semiconductor layer 101a.

Figure 14:
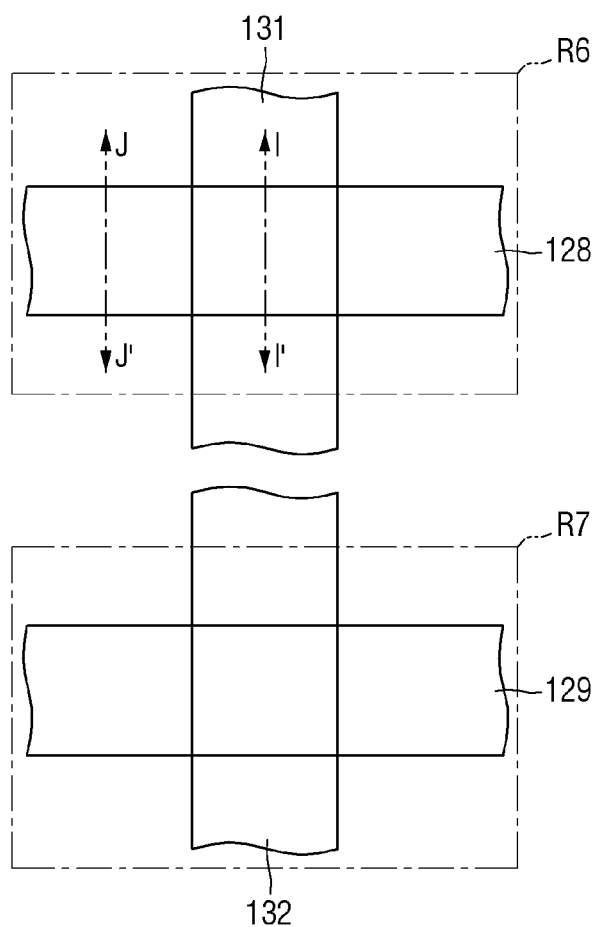

FIG. 14 is a layout diagram of a semiconductor device according to example embodiments.

Referring to FIG. 14, the substrate (see, e.g., 100 of FIG. 2) of the semiconductor device according to example embodiments includes a sixth region R6 and a seventh region R7. The sixth region R6 and the seventh region R7 may be spaced apart from or be connected to each other. The sixth region R6 and the seventh region R7 may be included in a same functional region, e.g., a logic region or an input/output (I/O). The sixth region R6 and the seventh region R7 may be regions in which transistors of different conductivity types are formed. In some embodiments, when an NMOS transistor is formed in the sixth region R6, a PMOS transistor may be formed in the seventh region R7. Alternatively, when a PMOS transistor is formed in the sixth region R6, an NMOS transistor may be formed in the seventh region R7.

An eighth fin pattern 128 is disposed in the sixth region R6. The first gate structure 131 traverses the eighth fin pattern 128 and extends in a direction crossing an extension direction of the eighth fin pattern 128. A ninth fin pattern 129 is disposed in the seventh region R7. The second gate structure 132 traverses the ninth fin pattern 129 and extends in a direction crossing an extension direction of the ninth fin pattern 129. In some embodiments, the first gate structure 131 and the second gate structure 132 may be connected to each other to form one gate structure. The eighth and ninth fin patterns 128 and 129 may have a substantially same shape. Therefore, hereinafter, descriptions of the eighth fin pattern 128 will be mainly made. The descriptions of the eighth fin pattern 128 will be also applied to the ninth fin pattern 129.

Figure 15:
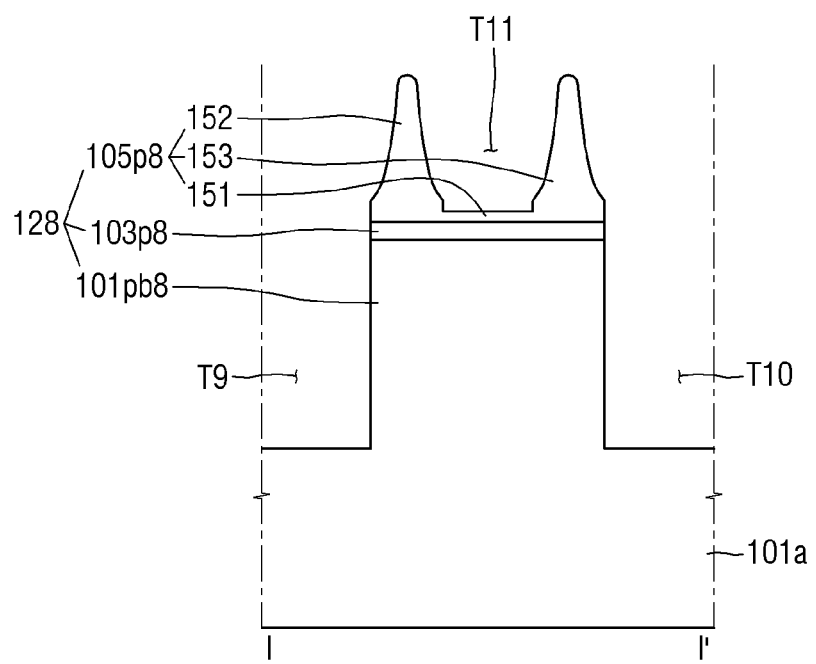

FIG. 15 is a cross-sectional view taken along line I-I' of FIG. 14. In FIG. 15, the field insulation layer 140, the first gate structure 131, and the second gate structure 132 are not illustrated for convenience.

Referring to FIG. 15, a ninth trench T9 and a tenth trench T10 that are spaced apart from each other are formed in the substrate (see, e.g., 100 of FIG. 2). The eighth fin pattern 128 may be defined by the ninth trench T9 and the tenth trench T10. Each of the ninth and tenth trenches T9 and T10 is formed in a portion of the lower substrate layer (see. e.g., 101 of FIG. 2), the buried insulation layer (see, e.g., 103 of FIG. 2), and the upper substrate layer (see, e.g., 105 of FIG. 2) (or each of the ninth and tenth trenches T9 and T10 passes through the upper substrate layer (see, e.g., 105 of FIG. 2), the buried insulation layer (see, e.g., 103 of FIG. 2), and a portion of the lower substrate layer (see, e.g., 101 of FIG. 2)). Bottom surfaces of the ninth and tenth trenches T9 and T10 may be defined by the base semiconductor layer 101a.

The eighth fin pattern 128 protrudes upward from the base semiconductor layer 101a. The eighth fin pattern 128 includes an eighth lower substrate pattern 101pb8, an eighth buried insulation pattern 103p8, and an eighth upper substrate pattern 105p8 that are sequentially stacked. The eighth upper substrate pattern 105p8 includes a first connection pattern 151, a first sub fin pattern 152, and a second sub fin pattern 153. A eleventh trench T11 is formed in the eighth upper substrate pattern 105p8. For example, the eleventh trench T11 may be formed between the first sub fin pattern 152 and the second sub fin pattern 153.

The first connection pattern 151 may define a bottom surface of the eleventh trench T11. The first and second sub fin patterns 152 and 153 may define sidewalls of the eleventh trench T11. The first sub fin pattern 152 and the second sub fin pattern 153 are spaced apart from each other and protrude upward from the eighth buried insulation pattern 103p8. The first connection pattern 151 connects the first sub fin pattern 152 and the second sub fin pattern 153.

Figure 16:
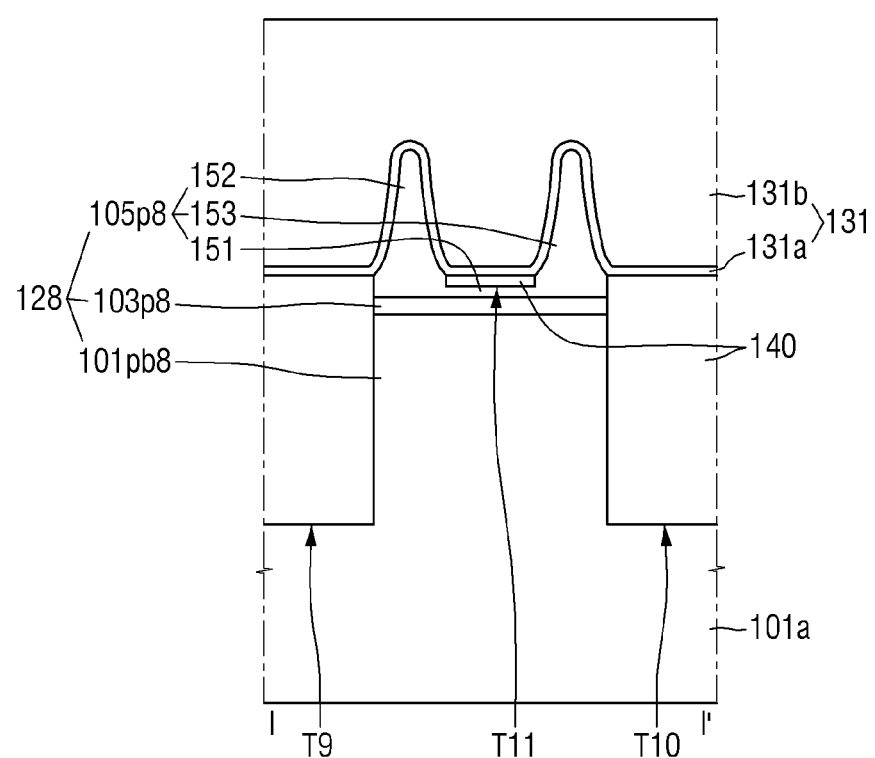

FIG. 16 is a cross-sectional view taken along line I-I' of FIG. 16.

Referring to FIG. 16, the field insulation layer 140 fills a portion of each of the ninth to eleventh trenches T9, T10, and T11. The field insulation layer 140 may cover sidewalls of a lower portion of the eighth upper substrate pattern 105p8, sidewalls of the eighth buried insulation pattern 103p8, and sidewalls of the eighth lower substrate pattern 101pb8. The field insulation layer 140 may cover sidewalls of lower portions of the first and second sub fin patterns 152 and 153. The field insulation layer 140 covers the first connection pattern 151. For example, the field insulation layer 140 may be disposed on an upper surface of the first connection pattern 151. The first gate structure 131 are disposed on the field insulation layer 140 and the eighth fin pattern 128.

Figure 17:
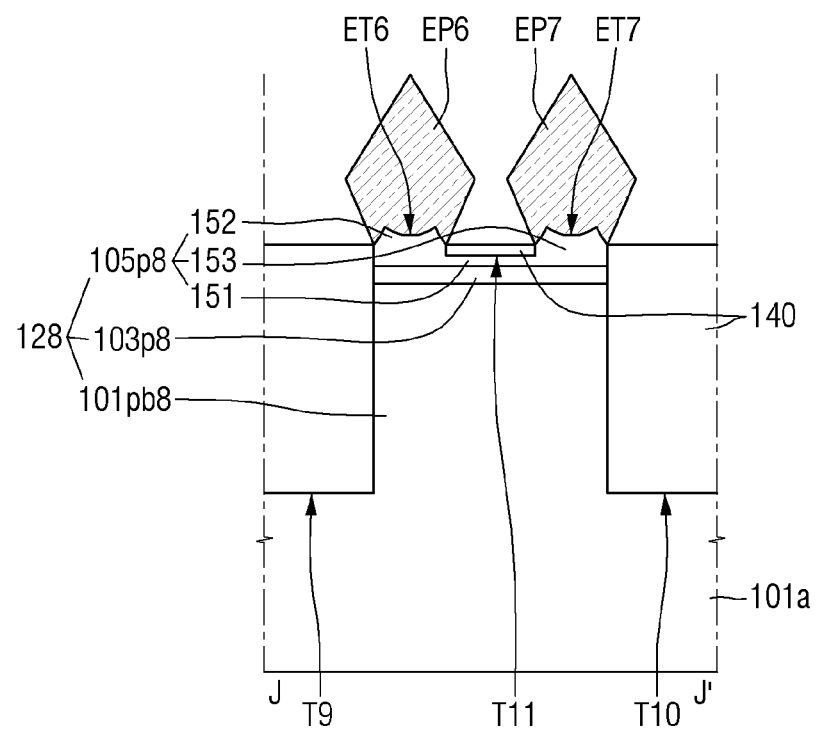

FIG. 17 is a cross-sectional view taken along line J-J' of FIG. 14.

Referring to FIG. 17, the first sub fin pattern 152 and the second sub fin pattern 153 include a sixth epi trench ET6 and a seventh epi trench ET7, respectively. The above descriptions of the first and second epi trenches ET1 and ET2 may be applied to the sixth and seventh epi trenches ET6 and ET7. A sixth epitaxial pattern EP6 and a seventh epitaxial pattern EP7 fill the sixth epi trench ET6 and the seventh epi trench ET7, respectively. The above descriptions of the first and second epitaxial patterns EP1 and EP2 may be applied to the sixth and seventh epitaxial patterns EP6 and EP7.

Figure 18:
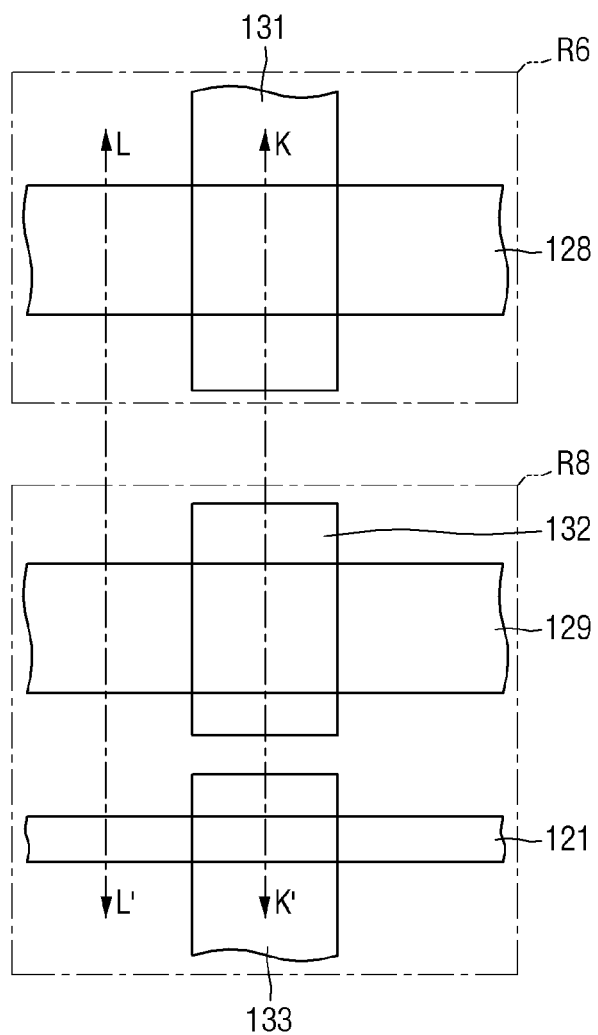

FIG. 18 is a layout diagram of a semiconductor device according to example embodiments.

Referring to FIG. 18, the substrate (see, e.g., 100 of FIG. 2) of the semiconductor device according to example embodiments includes the sixth region R6 and an eighth region R8. The sixth region R6 and the eighth region R8 may be spaced apart from or be connected to each other. The sixth region R6 and the eighth region R8 may be included in a same functional region, e.g., a logic region or an input/output (I/O). In some embodiment, the sixth region R6 and the eighth region R8 may be included in different functional regions, e.g., different regions among a logic region, an SRAM region, and an input/output (I/O) region. In some embodiments, the first and ninth fin patterns 121 and 129 are disposed in the eighth region R8.

A conductivity type of a transistor including the ninth fin pattern 129 and the second gate structure 132 may be the same as or different from a conductivity of a transistor including the first fin pattern 121 and the third gate structure 133.

Figure 19:
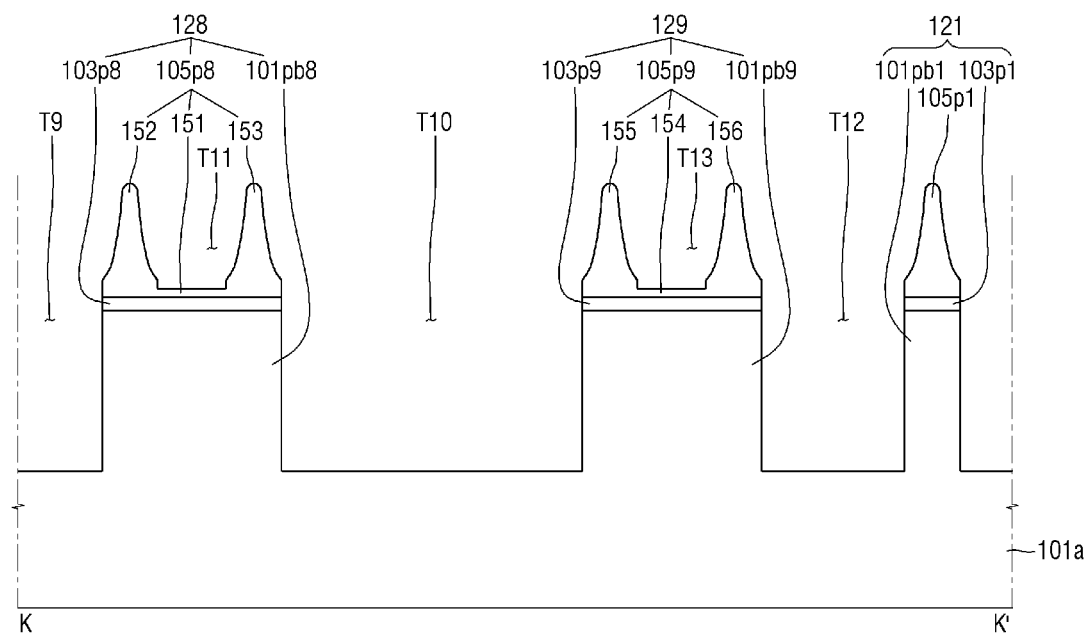

FIG. 19 is a cross-sectional view taken along line K-K' of FIG. 18. In FIG. 19, the field insulation layer 140 and the first to third gate structures 131, 132, and 133 are not illustrated for convenience.

Referring to FIG. 19, the ninth trench T9, the tenth trench T10, the eleventh trench T11, a twelfth trench T12, and a thirteenth trench T13 that are spaced apart from one another are formed in the substrate (see, e.g., 100 of FIG. 2). The ninth fin pattern 129 may be defined by the tenth trench T10 and the twelfth trench T12. The first fin pattern 121 may be defined by the twelfth trench T12.

The twelfth trench T12 is formed in a portion of the lower substrate layer (see, e.g., 101 of FIG. 2), the buried insulation layer (see, e.g., 103 of FIG. 2), and the upper substrate layer (see, e.g., 105 of FIG. 2) (or the twelfth trench T12 passes through the upper substrate layer (see, e.g., 105 of FIG. 2), the buried insulation layer (see, e.g., 103 of FIG. 2), and a portion of the lower substrate layer (see, e.g., 101 of FIG. 2)). A bottom surface of the twelfth trench T12 may be defined by the base semiconductor layer 101a.

The ninth fin pattern 129 protrudes upward from the base semiconductor layer 101a. The ninth fin pattern 129 includes a ninth lower substrate pattern 101pb9, a ninth buried insulation pattern 103p9, and a ninth upper substrate pattern 105p9 that are sequentially stacked. The ninth upper substrate pattern 105p9 includes a second connection pattern 154, and third and fourth sub fin patterns 155 and 156 connected by the second connection pattern 154. A thirteenth trench T13 is formed in the ninth upper substrate pattern 105p9. For example, the thirteenth trench T13 may be formed between the third sub fin pattern 155 and the fourth sub fin pattern 156. The above descriptions of the first connection pattern 151 and the first and second sub fin patterns 152 and 153 may be respectively applied to the second connection pattern 154 and the third and fourth sub fin patterns 155 and 156.

Figure 20:
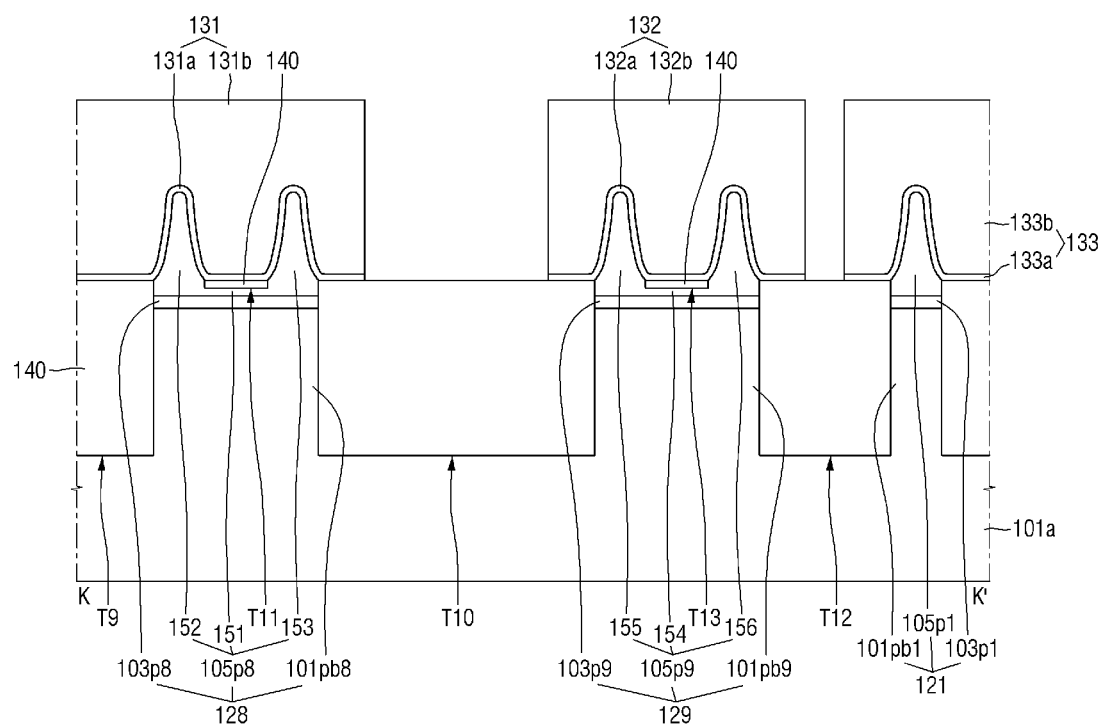

FIG. 20 is a cross-sectional view taken along line K-K' of FIG. 18.

Referring to FIG. 20, the field insulation layer 140 fills a portion of each of the ninth to thirteenth trenches T9, T10, T11, T12, and T13. The field insulation layer 140 may cover sidewalls of a lower portion of the ninth upper substrate pattern 105p9, sidewalls of the ninth buried insulation pattern 103p9, and sidewalls of the ninth lower substrate pattern 101pb9. The field insulation layer 140 may cover the second connection pattern 154. For example, the field insulation layer 140 may be disposed on an upper surface of the second connection pattern 154.

Figure 21:
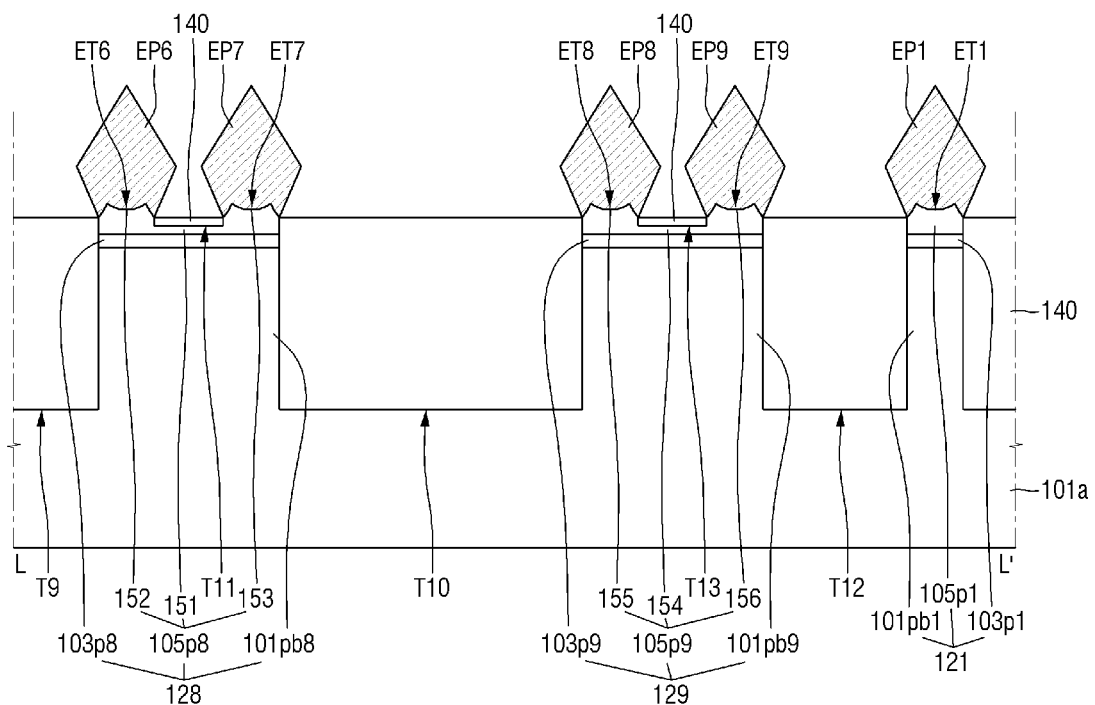

FIG. 21 is a cross-sectional view taken along line L-L' of FIG. 18.

Referring to FIG. 21, the third sub fin pattern 155 and the fourth sub fin pattern 156 include an eighth epi trench ET8 and a ninth epi trench ET9, respectively. The above descriptions of the first and second epi trenches ET1 and ET2 may be applied to the eighth and ninth epi trenches ET8 and ET9. An eighth epitaxial pattern EP8 and a ninth epitaxial pattern EP9 fill the eighth epi trench ET8 and the ninth epi trench ET9, respectively. The above descriptions of the first and second epitaxial patterns EP1 and EP2 may be applied to the eighth and ninth epitaxial patterns EP8 and EP9.

Figure 22:
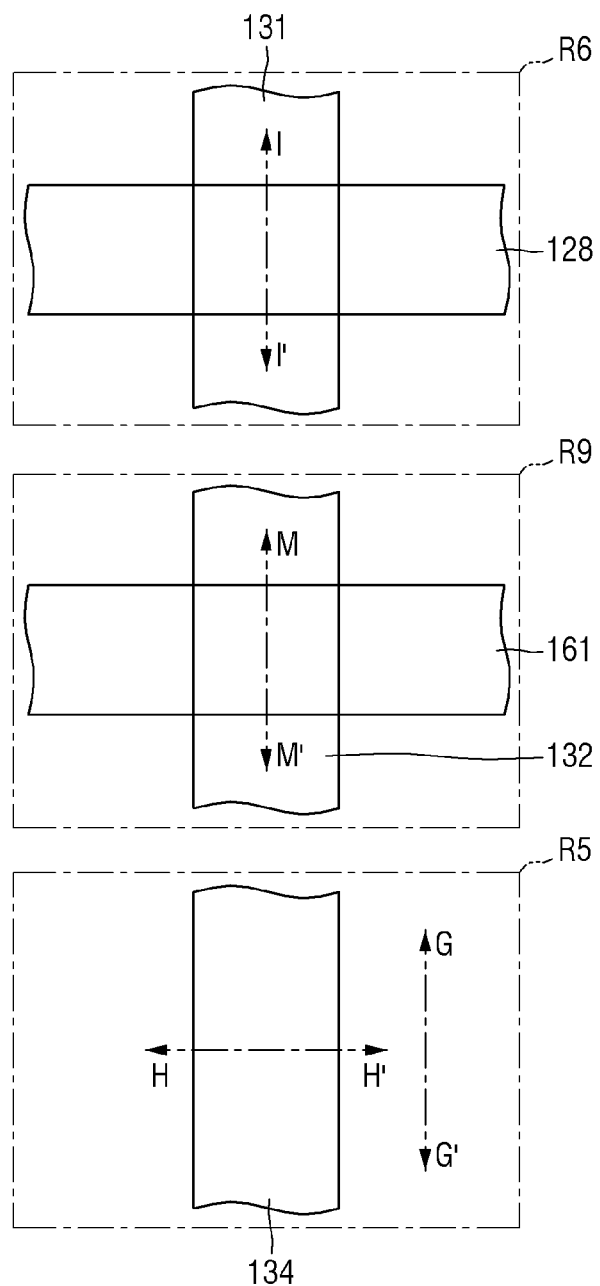

FIG. 22 is a layout diagram of a semiconductor device according to example embodiments.

Referring to FIG. 22, the substrate (see, e.g., 100 of FIG. 2) of the semiconductor device according to example embodiments includes the fifth region R5, the sixth region R6 and a ninth region R9. The fifth region R5, the sixth region R6, and the ninth region R9 may be spaced apart from or be connected to one another. The fifth region R5, the sixth region R6, and the ninth region R9 may be included in a same functional region, e.g., a logic region or an input/output (I/O). In some embodiment, the fifth region R5, the sixth region R6, and the ninth region R9 may be included in different functional regions, e.g., different regions among a logic region, an SRAM region, and an input/output (I/O) region. In some embodiments, a tenth fin pattern 161 is disposed in the ninth region R9.

FIG. 22 is a cross-sectional view taken along lines I-I', M-M' and G-G' of FIG. 22. In FIG. 22, the field insulation layer 140 and the first and second gate structures 131 and 132 are not illustrated for convenience.

Figure 23:
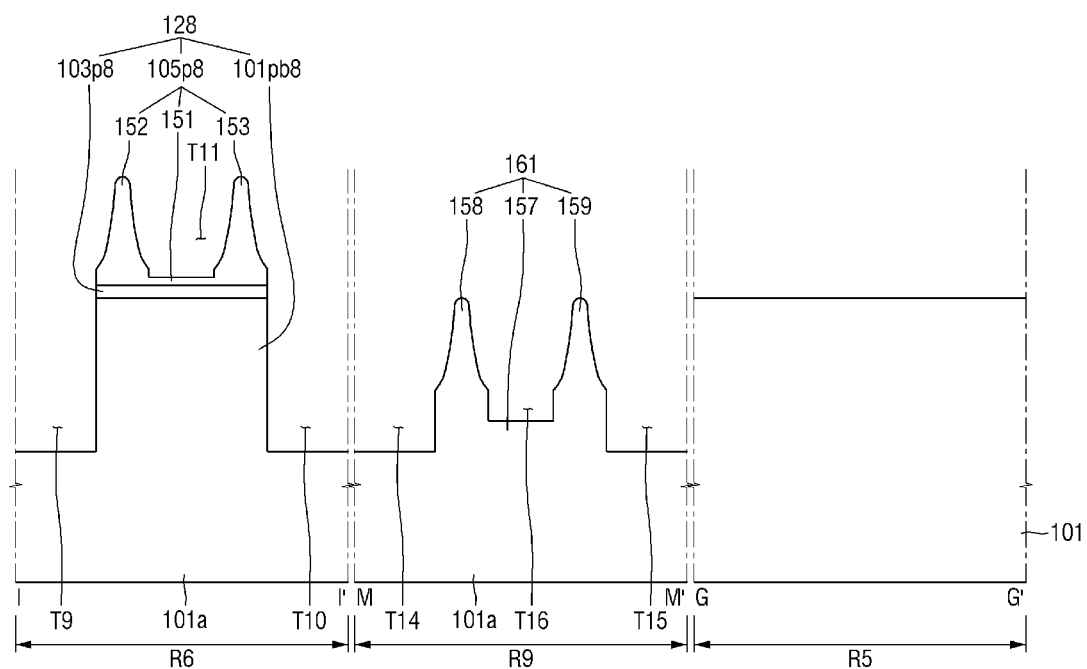

Referring to FIG. 23, the ninth region R9 includes only the lower substrate layer 101 without the buried insulation layer (see, e.g., 103 of FIG. 2) and the upper substrate layer (see, e.g., 105 of FIG. 2). The lower substrate layer 101 includes a fourteenth trench T14 and a fifteenth trench T15 therein, A tenth fin pattern 161 may be defined by the fourteenth trench T14 and the fifteenth trench T15.

The tenth fin pattern 161 includes a third connection pattern 157 and fifth and sixth sub fin patterns 158 and 159. A sixteenth trench T16 is formed in the tenth fin pattern 161. For example, the sixteenth trench T16 may be formed between the fifth sub fin pattern 158 and the sixth sub fin pattern 159. The third connection pattern 157 may define a bottom surface of the sixteenth trench T16. The fifth and sixth sub fin patterns 158 and 159 may define sidewalls of the sixteenth trench T16. The fifth sub fin pattern 158 and the sixth sub fin pattern 159 are spaced apart from each other and protrude upward from the base semiconductor layer 101a. The third connection pattern 157 may connect the fifth sub fin pattern 158 and the sixth sub fin pattern 159.

Figure 24:
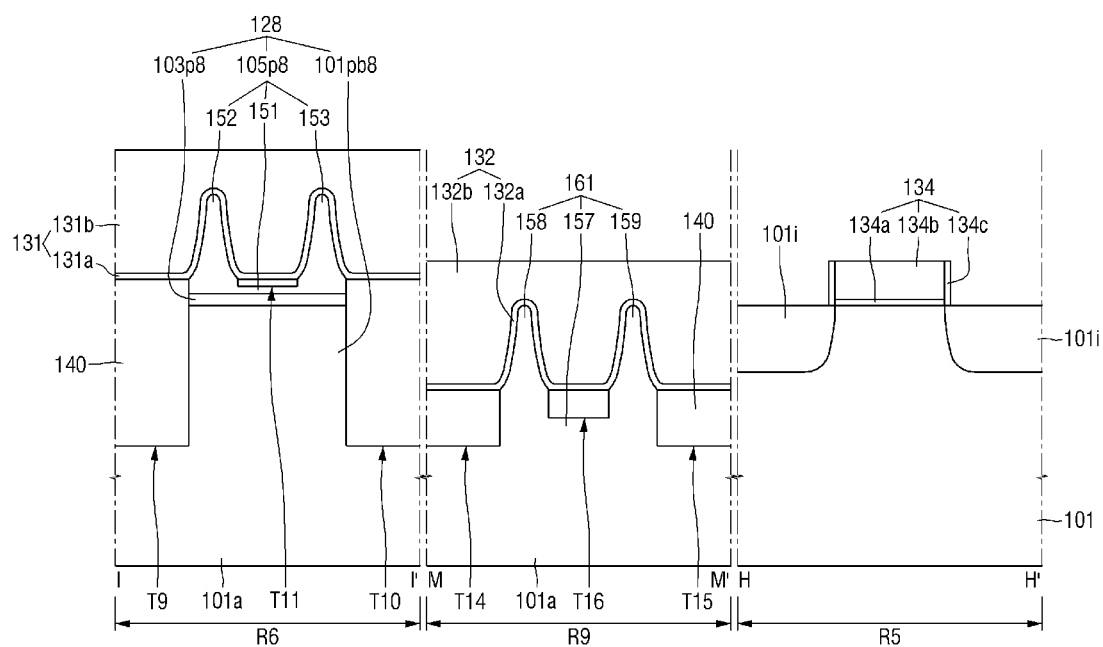

FIG. 24 is a cross-sectional view taken along lines I-I', M-M', and H-H' of FIG. 22.

Referring to FIG. 24, the field insulation layer 140 fills a portion of each of the fourteenth to sixteenth trenches T14, T15, and T16.

Figure 25:
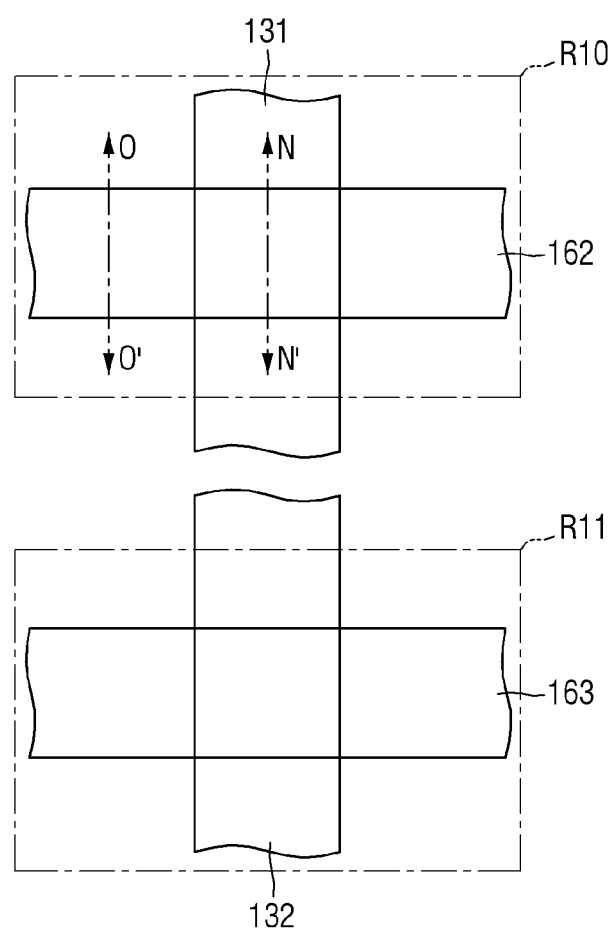

FIG. 25 is a layout diagram of a semiconductor device according to example embodiments.

Referring to FIG. 25, the substrate (see, e.g., 100 of FIG. 2) of the semiconductor device according to example embodiments includes a tenth region R10 and an eleventh region R11. The tenth region R10 and the eleventh region R11 may be spaced apart from or be connected to each other. The tenth region R10 and the eleventh region R11 may be included in a same functional region, e.g., a logic region or an input/output (I/O). The tenth region R10 and the eleventh region R11 may be regions in which transistors of different conductivity types are formed. In some embodiments, when an NMOS transistor is formed in the tenth region R10, a PMOS transistor may be formed in the eleventh region R11. Alternatively, when a PMOS transistor is formed in the tenth region R10, an NMOS transistor may be formed in the eleventh region R11.

An eleventh fin pattern 162 is disposed in the tenth region R10. A twelfth fin pattern 163 is disposed in the eleventh region R11. The eleventh and twelfth fin patterns 162 and 163 may have a substantially same shape. Therefore, hereinafter, descriptions of the eleventh fin pattern 162 will be mainly made. The descriptions of the eleventh fin pattern 162 will be also applied to the twelfth fin pattern 163.

Figure 26:
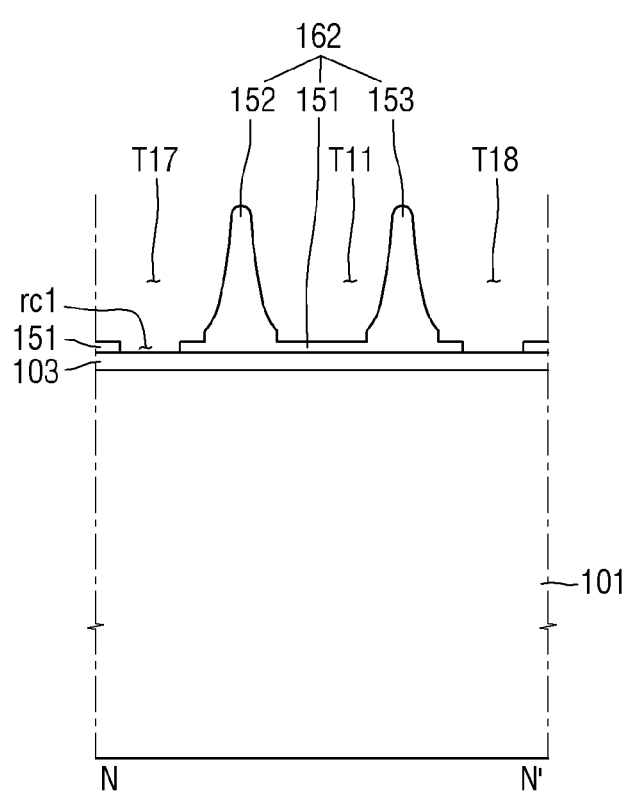

FIG. 26 is a cross-sectional view taken along line N-N' of FIG. 25. In FIG. 26, the field insulation layer 140, the first gate structure 131, and the second gate structure 132 are not illustrated for convenience.

Referring to FIG. 26, a seventeenth trench T17 and an eighteenth trench T18 that are spaced apart from each other are formed in the substrate (see, e.g., 100 of FIG. 2) of the semiconductor device according to example embodiments. The seventeenth trench T17 and the eighteenth trench T18 are formed in the upper substrate layer (see, e.g., 105 of FIG. 2) to expose the buried insulation layer 103. Bottom surfaces of the seventeenth trench T17 and the eighteenth trench T18 may be defined by the buried insulation layer 103. The seventeenth trench T17 includes a recess rc1 formed in the first connection pattern 151, at the bottom surface thereof. The recess rc1 may expose the buried insulation layer 103. The eleventh fin pattern 162 may be defined by the seventeenth trench T17 and the eighteenth trench T18. The eleventh fin pattern 162 protrudes upward from the buried insulation layer 103. The eleventh fin pattern 162 includes the first connection pattern 151 and the first and second sub fin patterns 152 and 153 connected by the first connection pattern 151.

Figure 27:
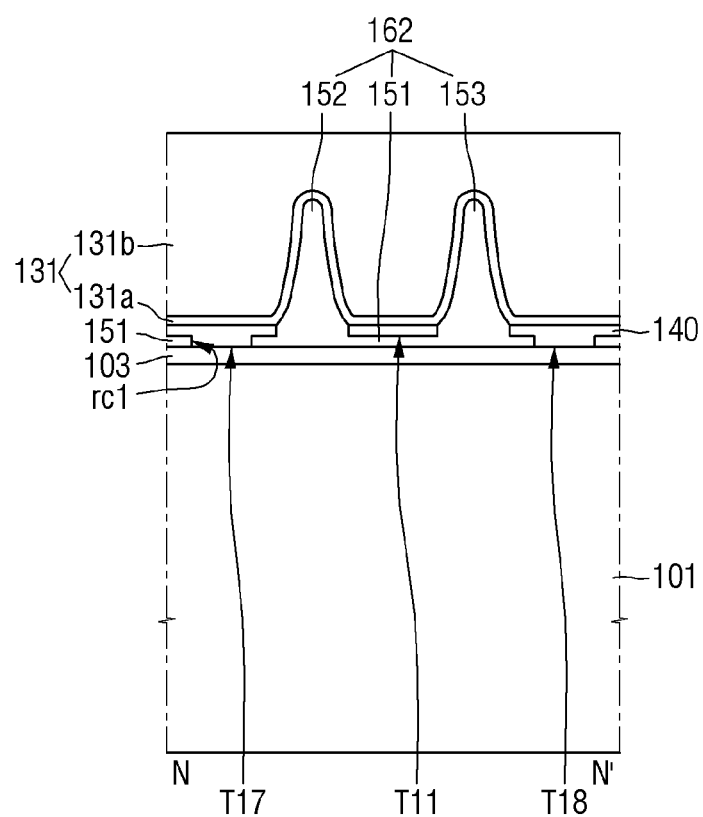

FIG. 27 is a cross-sectional view taken along line N-N' of FIG. 25.

Referring to FIG. 27, the field insulation layer 140 fills a portion of each of the eleventh trench T11, the seventeenth trench T17, and the eighteenth trench T18. The field insulation layer 140 may cover sidewalls of lower portions of the first and second sub fin patterns 152 and 153. The field insulation layer 140 may fill the recess rc1.

Figure 28:
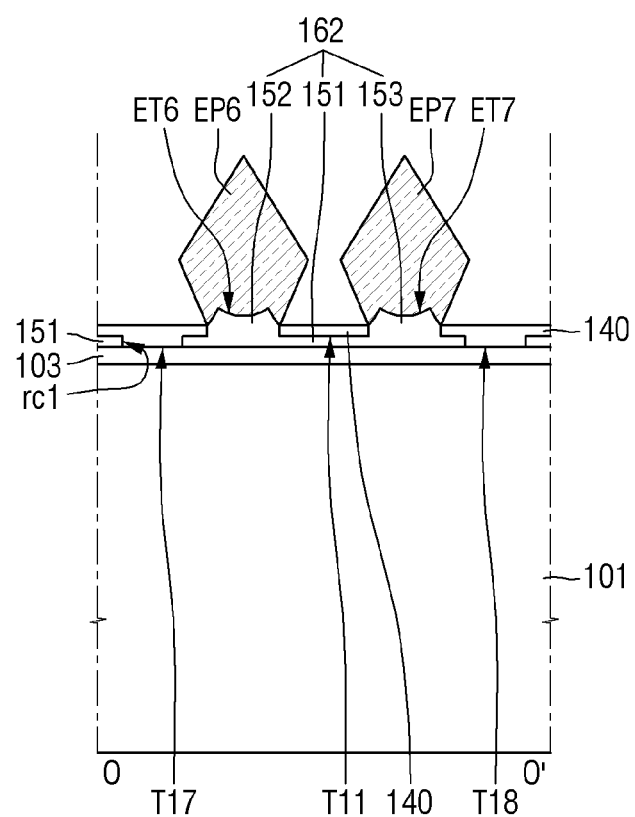

FIG. 28 is a cross-sectional view taken along line O-O' of FIG. 25.

Referring to FIG. 28, the first sub fin pattern 152 and the second sub fin pattern 153 include a sixth epi trench ET6 and a seventh epi trench ET7, respectively. The sixth epitaxial pattern EP6 and a seventh epitaxial pattern EP7 fill the sixth epi trench ET6 and the seventh epi trench ET7, respectively FIG. 29 is a layout diagram of a semiconductor device according to example embodiments.

Figure 29:
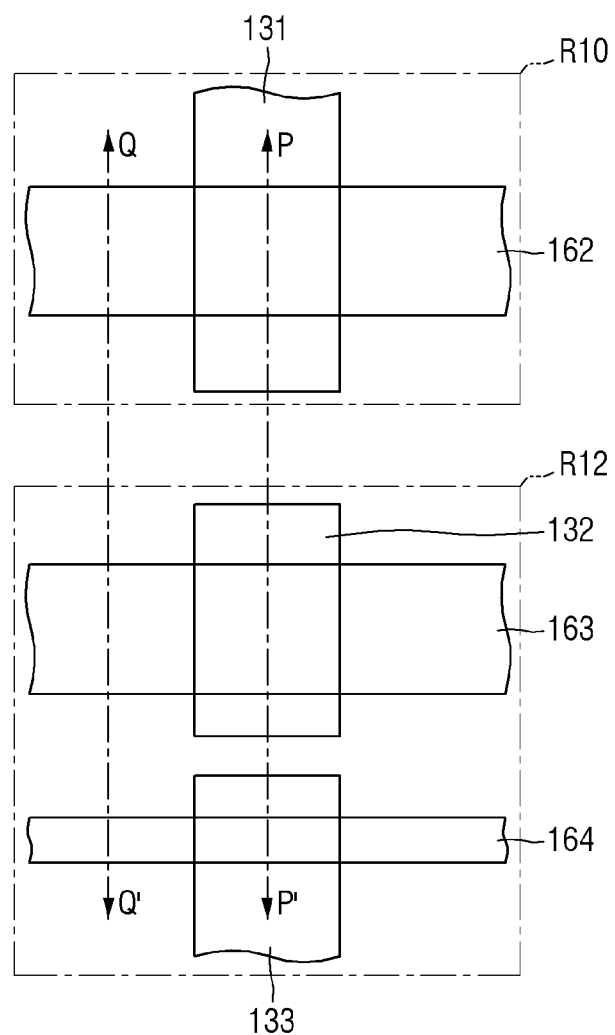

Referring to FIG. 29, the substrate (see, e.g., 100 of FIG. 2) of the semiconductor device according to example embodiments includes the tenth region R10 and a twelfth region R12. The tenth region R10 and the twelfth region R12 may be spaced apart from or be connected to each other. The tenth region R10 and the twelfth region R12 may be included in a same functional region, e.g., a logic region or an input/output (I/O). In some embodiment, the tenth region R10 and the twelfth region R12 may be included in different functional regions, e.g., different regions among a logic region, an SRAM region, and an input/output (I/O) region. In some embodiments, the twelfth fin pattern 163 and a thirteenth fin pattern 164 are disposed in the twelfth region R12.

In some embodiments, a conductivity type of a transistor including the twelfth fin pattern 163 and the second gate structure 132 may be the same as or different from a conductivity type of a transistor including the thirteenth fin pattern 164 and the third gate structure 133.

Figure 30:
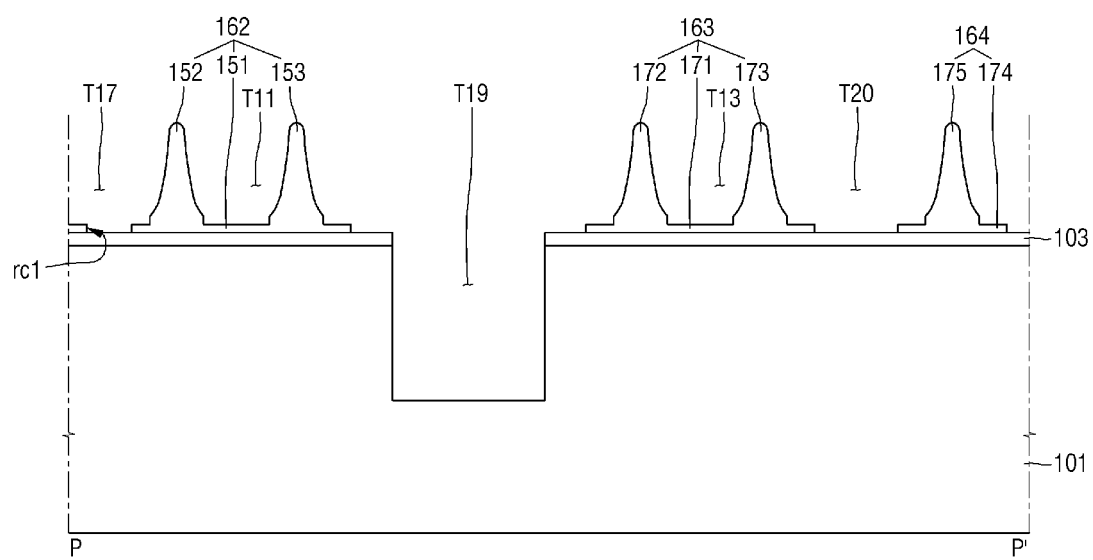

FIG. 30 is a cross-sectional view taken along line P-P' of FIG. 29. In FIG. 30, the field insulation layer 140 and the first and second gate structures 131 and 132 are not illustrated for convenience.

Referring to FIG. 30, the eleventh trench T11, the thirteenth trench T13, the seventeenth trench T17, a nineteenth trench T19, and a twentieth trench T20 that are spaced apart from each other are formed in the substrate (see, e.g., 100 of FIG. 2). The eleventh fin pattern 162 may be defined by the seventeenth trench T17 and the nineteenth trench T19. The twelfth fin pattern 163 may be defined by the nineteenth trench T19 and the twentieth trench T20. The thirteenth fin pattern 164 may be defined by the twentieth trench T20. The nineteenth trench T19 is formed in a portion of the lower substrate layer 101, the buried insulation layer 103, and the upper substrate layer (see, e.g., 105 of FIG. 2) (or the nineteenth trench T19 passes through the upper substrate layer (see, e.g., 105 of FIG. 2), the buried insulation layer 103, and a portion of the lower substrate layer 101), unlike the eleventh, thirteenth, seventeenth, and twentieth trenches T11, T13, T17, and T20.

The twelfth fin pattern 163 includes a fourth connection pattern 171 and seventh and eighth sub fin patterns 172 and 173 connected by the fourth connection pattern 171. The twelfth fin pattern 163 may have substantially the same shape as the eleventh fin pattern 162. The thirteenth fin pattern 164 includes a fifth connection pattern 174 and a ninth sub fin pattern 175. The ninth sub fin pattern 175 protrudes upward from the buried insulation layer 103.

Figure 31:
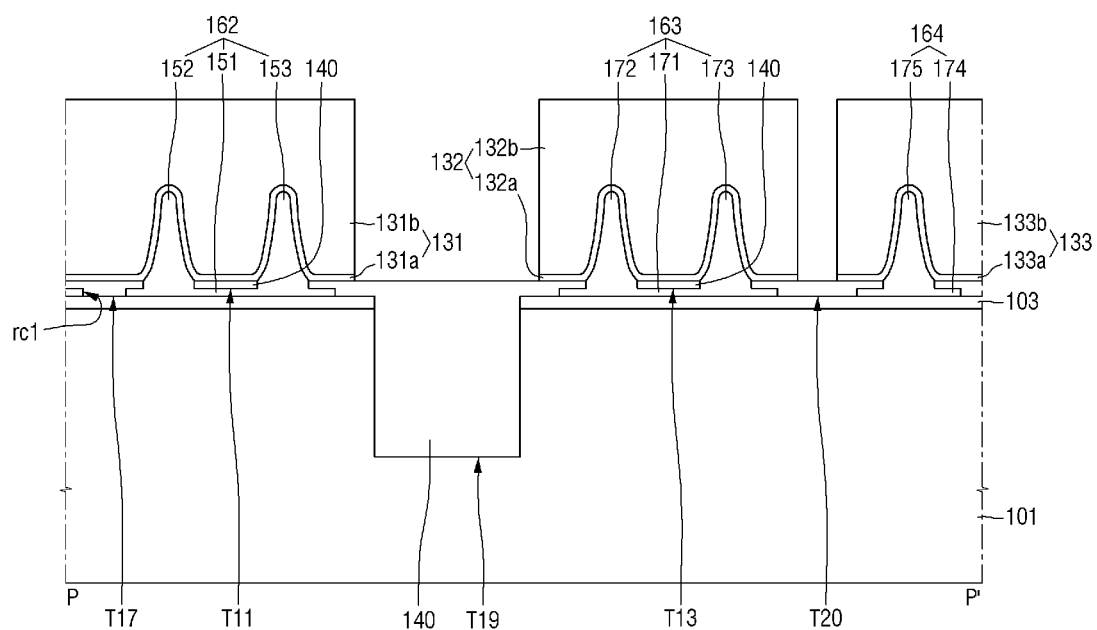

FIG. 31 is a cross-sectional view taken along line P-P' of FIG. 29.

Referring to FIG. 31, the field insulation layer 140 fills a portion of each of the eleventh, thirteenth, seventeenth, eighteenth, and twentieth trenches T11, T13, T17, T19, and T20. The field insulation layer 140 may cover sidewalls of lower portions of the seventh and eighth sub fin patterns 172 and 173 and sidewalls of the ninth sub fin pattern 175. The field insulation layer 140 may cover the fourth and fifth connection patterns 171 and 174.

Figure 32:
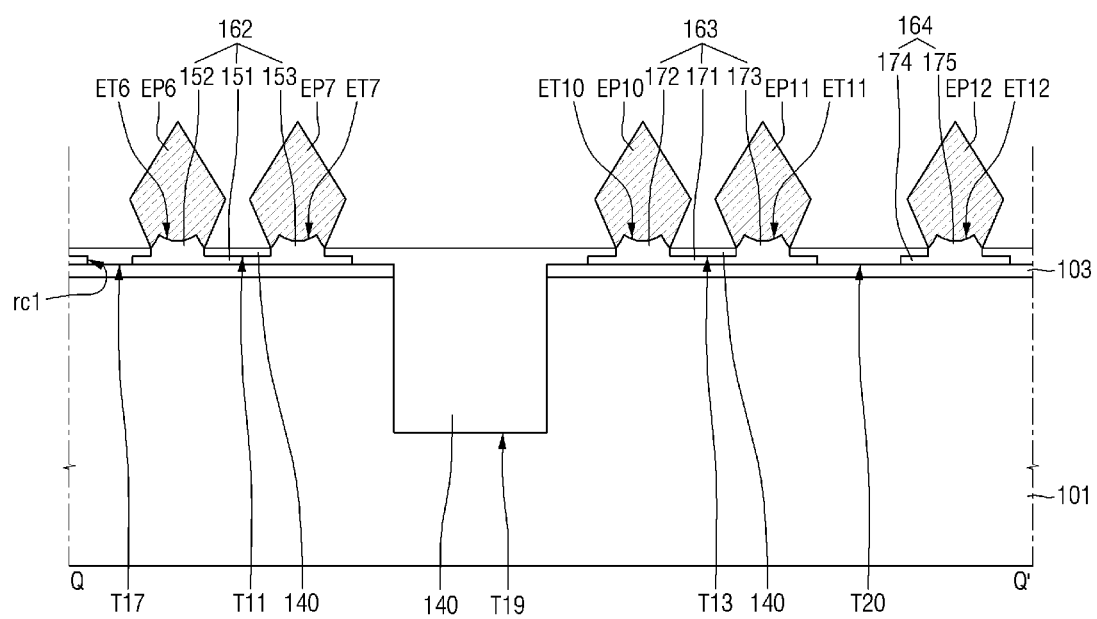

FIG. 32 is a cross-sectional view taken along line Q-Q' of FIG. 29.

Referring to FIG. 32, the seventh sub fin pattern 172 and the eighth sub fin pattern 173 include a tenth epi trench ET10 and an eleventh epi trench ET11, respectively. The ninth sub fin pattern 175 includes a twelfth epi trench ET12. The above descriptions of the first and second epi trenches ET1 and ET2 may be applied to the tenth to twelfth epi trenches ET10, ET11, and ET12. A tenth epitaxial pattern EP10, an eleventh epitaxial pattern EP11, and a twelfth epitaxial pattern EP12 fill the tenth epi trench ET10, the eleventh epi trench ET11, and the twelfth epi trench ET12, respectively. The above descriptions of the first and second epitaxial patterns EP1 and EP2 may be applied to the tenth to twelfth epitaxial patterns EP10, EP11, and EP12.

Figure 33:
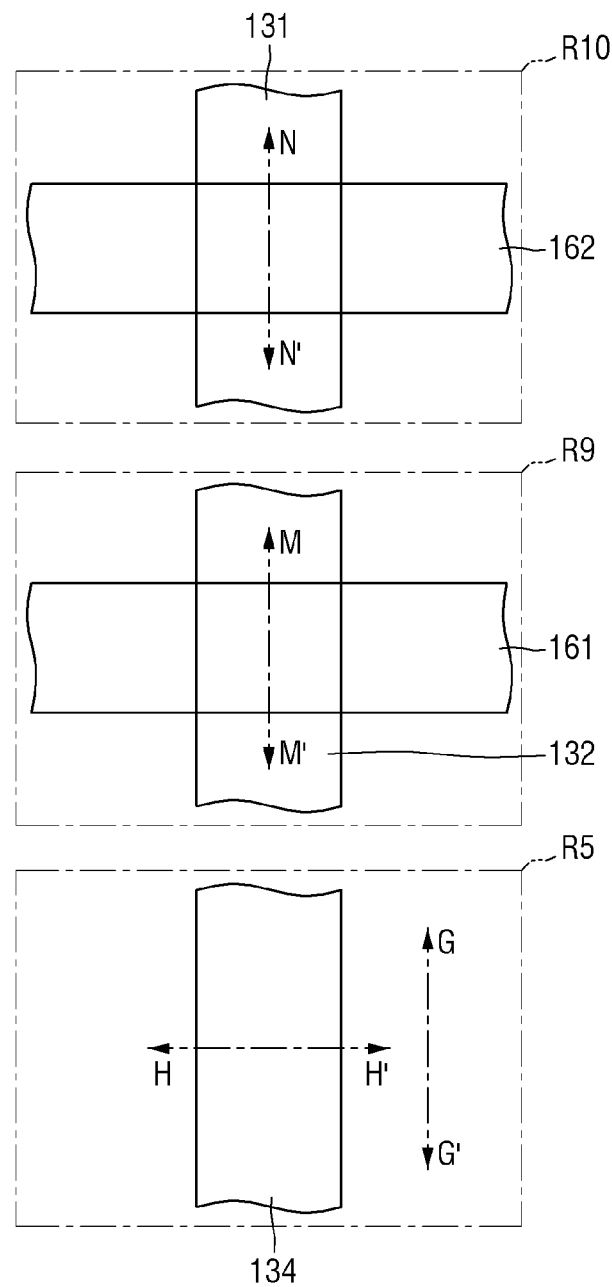
Figure 34:
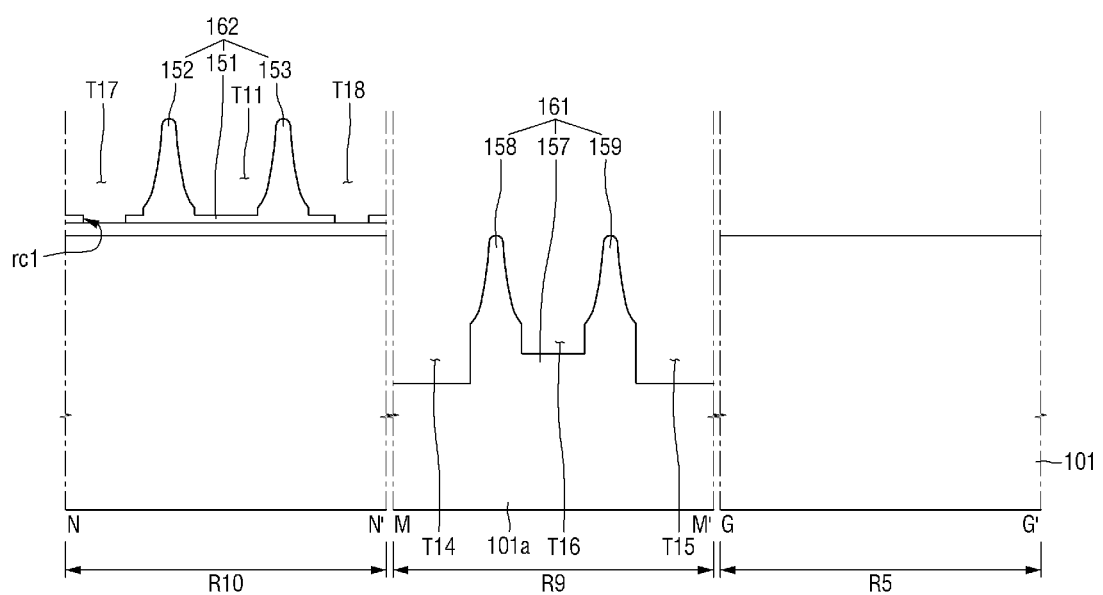
Figure 35:
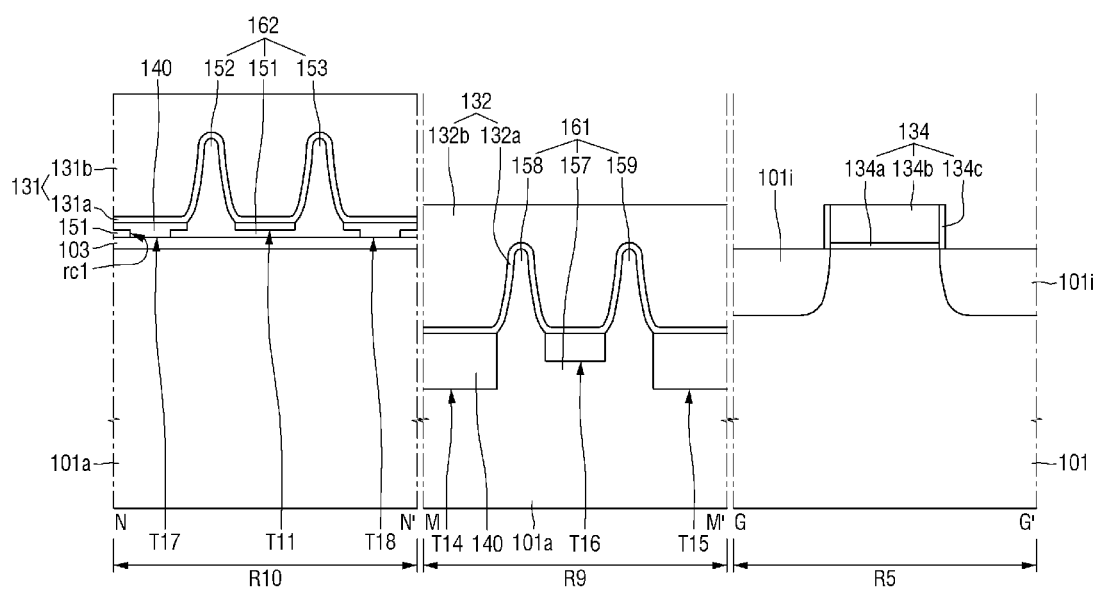

FIG. 33 is a layout diagram of a semiconductor device according to example embodiments. FIG. 34 is a cross-sectional view taken along lines N-N', M-M', and G-G' of FIG. 33. In FIG. 34, the field insulation layer 140 and the first and second gate structures 131 and 132 are not illustrated for convenience. FIG. 35 is a cross-sectional view taken along lines N-N', M-M', and H-H' of FIG. 33.

Referring to FIGS. 33 to 35, the substrate (see, e.g., 100 of FIG. 2) of the semiconductor device according to example embodiments includes the fifth region R5, the ninth region R9, and the tenth region R10. The fifth region R5, the ninth region R9, and the tenth region R10 may be spaced apart from or be connected to one another. The fifth region R5, the ninth region R9, and the tenth region R10 may be included in a same functional region, e.g., a logic region or an input/output (I/O). In some embodiment, the fifth region R5, the ninth region R9, and the tenth region R10 may be included in different functional regions, e.g., different regions among a logic region, an SRAM region, and an input/output (I/O) region. The eleventh fin pattern 162 as described with reference to FIGS. 26 and 27 is disposed in the tenth region R10. The tenth fin pattern 161 as described with reference to FIGS. 23 and 24 is disposed in the ninth region R9. The fifth region R5 may be a region in which the planar transistor as described with reference to FIGS. 23 and 24 is formed.

Hereinafter, a method of manufacturing a semiconductor device according to example embodiments will be described with reference to FIGS. 2, 3, and 36. The same reference numerals are used to denote the same elements throughout the specification, and thus duplicated descriptions thereof will be omitted or be briefly mentioned. FIG. 35 is a perspective view of a method of manufacturing a semiconductor device according to example embodiments.

Figure 36:
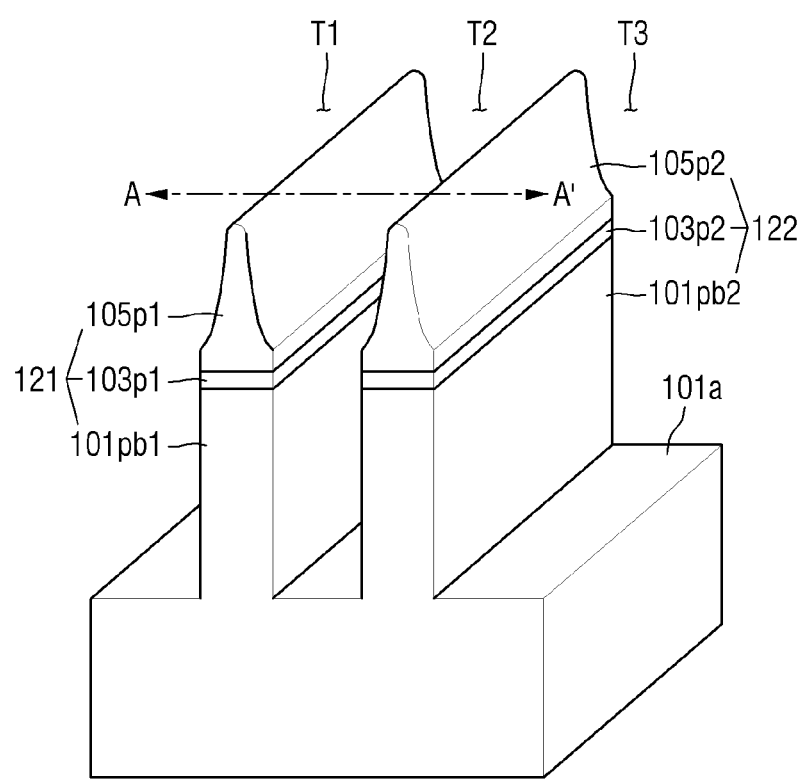
FIGS. 36 to 40 are cross-sectional views of stages in a method of manufacturing a semiconductor device according to example embodiments.

Referring to FIGS. 2, 3, and 36, the substrate 100 including the lower substrate layer 101, the buried insulation layer 103, and the upper substrate layer 105 that are sequentially stacked is provided. The first fin pattern 121 is formed by patterning the substrate 100. For example, the first trench T1 is formed by etching the first trench forming region RT1 of the substrate 100, and the second trench T2 is formed by etching the second trench forming region RT2 of the substrate 100. According to the formation of the first and second trenches T1 and the T2, the lower substrate layer 101 is patterned such that the base semiconductor layer 101a and the first lower substrate pattern 101pb1 are formed. In addition, the buried insulation layer 103 is patterned to form the first buried insulation pattern 103p1. The upper substrate layer 105 is patterned to form the first upper substrate pattern 105p1. A cross-sectional view taken along line A-A' of FIG. 36 is the cross-sectional view of FIG. 3.

Figure 37:
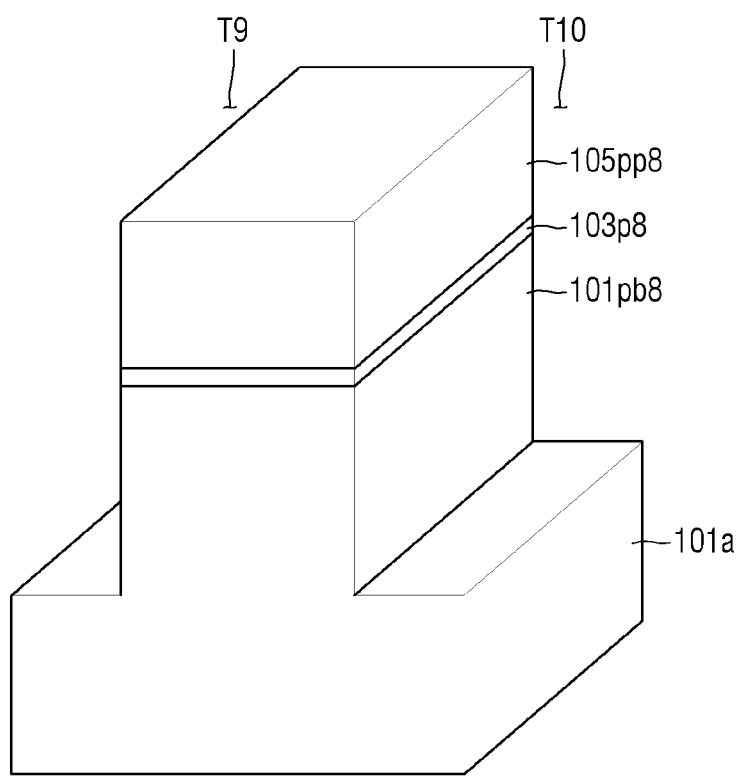
Figure 38:
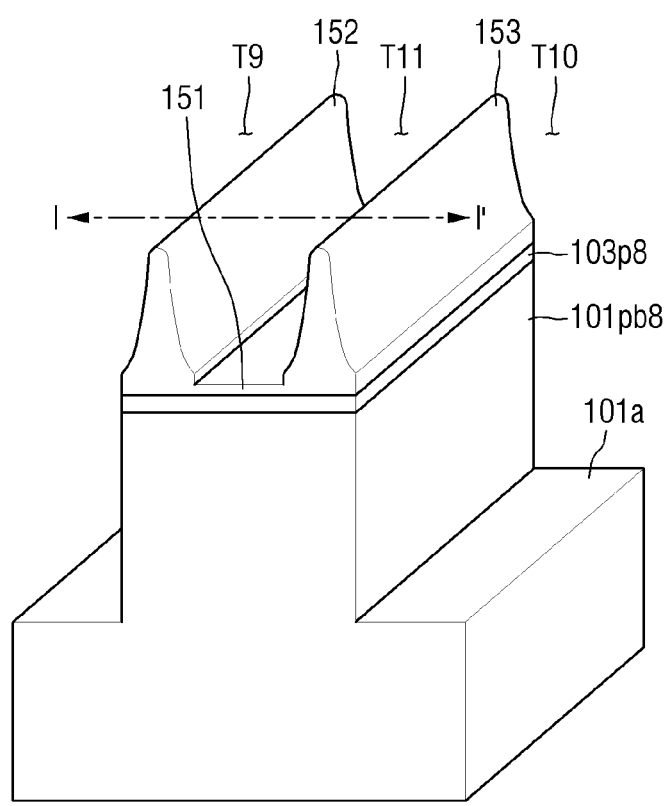

Hereinafter, a method of manufacturing a semiconductor device according to example embodiments will be described with reference to FIGS. 2, 15, 37, and 38. The same reference numerals are used to denote the same elements throughout the specification, and thus duplicated descriptions thereof will be omitted or be briefly mentioned. FIGS. 37 and 38 are perspective views of a method of manufacturing a semiconductor device according to example embodiments.

Referring to FIGS. 2 and 37, the substrate 100 is patterned to form the base semiconductor layer 101a, the eighth lower substrate pattern 101pb8, the eighth buried insulation pattern 103p8, and a free eighth upper substrate pattern 105pp8.

Referring to FIGS. 15 and 38, the eleventh trench T11 is formed in the free eighth upper substrate pattern 105pp8 of FIG. 37. Thus, the first connection pattern 151 defining the bottom surface of the eleventh trench T11 and the first and second sub fin patterns 152 and 153 defining the sidewalls of the eleventh trench T11 are formed. A cross-sectional view taken along line I-I' of FIG. 38 is the cross-sectional view of FIG. 15.

Figure 39:
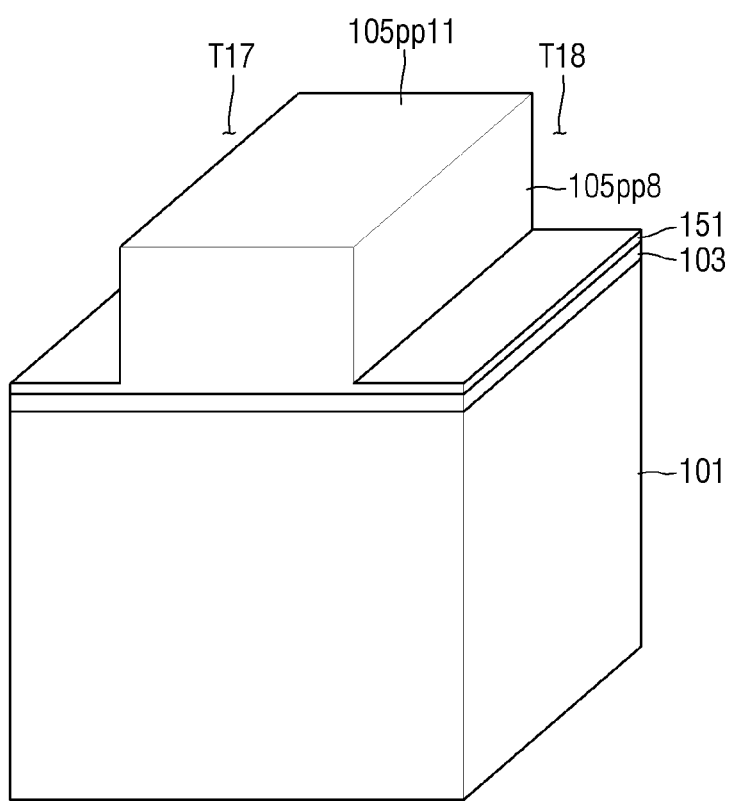
Figure 40:
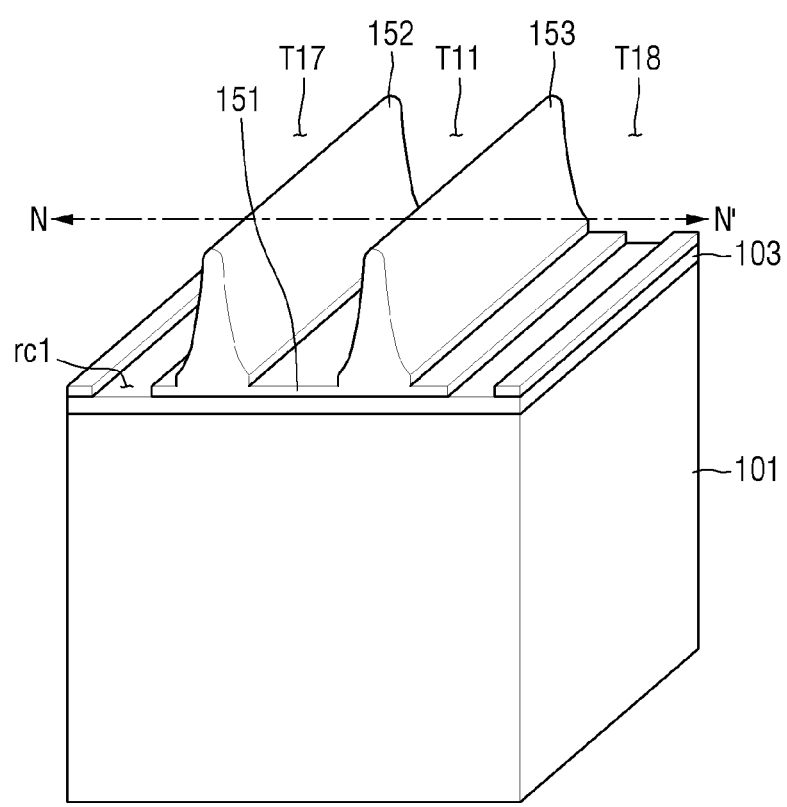

Hereinafter, a method of manufacturing a semiconductor device according to example embodiments will be described with reference to FIGS. 2, 26, 39, and 40. The same reference numerals are used to denote the same elements throughout the specification, and thus duplicated descriptions thereof will be omitted or be briefly mentioned. FIGS. 39 and 40 are perspective views of a method of manufacturing a semiconductor device according to example embodiments.

Referring to FIGS. 2 and 39, the upper substrate layer 105 of the substrate 100 is patterned to form the first connection pattern 151 and a free eleventh upper substrate pattern 105pp11.

Referring to FIGS. 26 and 40, the recess rc1 is formed by removing a portion of the first connection pattern 151 exposed by the seventeenth trench T17. The recess rc1 exposes the buried insulation layer 103. A bottom surface of the recess rc1 may be defined by the buried insulation layer 103, and sidewalls thereof may be defined by the first connection pattern 151. The eleventh trench T11 is formed in the free eleventh upper substrate pattern 105pp11 of FIG. 39. A cross-sectional view taken along line N-N' of FIG. 40 is the cross-sectional view of FIG. 26.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a substrate including a lower substrate layer, a buried insulation layer on the lower substrate layer, and an upper substrate layer on the buried insulation layer, the buried insulation layer being formed of silicon oxide without germanium (Ge),
the substrate having
a first trench passing through the upper substrate layer, the buried insulation layer, and a portion of the lower substrate layer,
a second trench passing through the upper substrate layer, the buried insulation layer, and a portion of the lower substrate layer and spaced apart from the first trench, and
a first fin pattern defined by the first trench and the second trench; and
a field insulation layer in a portion of the first trench and in a portion of the second trench, wherein an upper surface of the field insulation layer is higher than an upper surface of the buried insulation layer.

2. The device according to claim 1, wherein the first fin pattern includes a first buried insulation pattern that is a portion of the buried insulation layer between the first trench and the second trench, and includes a first upper substrate pattern that is a portion of the upper substrate layer between the first trench and the second trench,
wherein the first upper substrate pattern includes a first sub fin pattern and a second sub fin pattern that protrude from the first buried insulation pattern and includes a first connection pattern connecting the first sub fin pattern and the second sub fin pattern.

3. The device according to claim 1, wherein the first fin pattern includes a first upper substrate pattern that is a portion of the first upper substrate between the first trench and the second trench,
wherein the first upper substrate pattern has an epi trench, and
wherein the device further comprises a first epitaxial pattern filing the epi trench.

4. The device according to claim 1, wherein the substrate includes a first region, a second region, and a third region that are spaced apart from one another,
wherein the first fin pattern is in the first region, and
wherein each of the second region and the third region includes the lower substrate layer and does not include the buried insulation layer.

5. The device according to claim 4, wherein the lower substrate layer has:
a third trench;
a fourth trench; and
a second fin pattern defined by the third trench and the fourth trench,
wherein the field insulation layer is in a portion of third trench and in a portion of the fourth trench.

6. The device according to claim 1, wherein the lower substrate layer includes a base semiconductor layer defining bottom surfaces of the first and second trenches and includes a first lower substrate pattern protruding from the base semiconductor layer and defining portions of sidewalls of the first and second trenches,
wherein the first fin pattern includes the first lower substrate pattern, a first buried insulation pattern that is a portion of the buried insulation layer between the first trench and the second trench, and a first upper substrate pattern that is a portion of the upper substrate layer between the first trench and the second trench,
wherein the first upper substrate pattern includes a first portion having a sidewall covered by the field insulation layer and a second portion on the first portion, and
wherein a height from an upper surface of the field insulation layer to an upper surface of the second portion of the first upper substrate pattern is greater than twice a thickness of the first buried insulation pattern.

7. The device according to claim 1, wherein the substrate includes a first region and a second region, adjacent to each other,
wherein the first fin pattern is in the first region,
wherein the substrate has a third trench passing through the upper substrate layer, the buried insulation layer, and a portion of the lower substrate layer, between the first region and the second region, and
wherein the field insulation layer is in a portion of the third trench.

8. The device according to claim 1, wherein the substrate includes a first region and a second region adjacent to each other, wherein the first fin pattern is in the first region, wherein the second region includes the lower substrate layer and does not include the buried insulation layer, wherein the substrate has a third trench in the lower substrate layer between the first region and the second region, and wherein the field insulation layer is in a portion of the third trench.

9. A semiconductor device comprising:

a base semiconductor layer;

a first fin pattern protruding from the base semiconductor layer and including a first lower substrate pattern, a first buried insulation pattern, and a first upper substrate pattern that are sequentially stacked, wherein the first lower substrate pattern includes a same material as the base semiconductor layer;

a field insulation layer on the base semiconductor layer and covering a sidewall of the first lower substrate pattern, a sidewall of the first buried insulation pattern, and a sidewall of a lower portion of the first upper substrate pattern; and a first epitaxial pattern filling a trench in the first upper substrate pattern, wherein an upper portion of the trench is located above an upper surface of the field insulation layer.

10. The device according to claim 9, wherein the buried insulation pattern includes an oxide of one of a material included in the first upper substrate pattern and a material include in the first lower substrate pattern.

11. The device according to claim 9, further comprising a substrate including a lower substrate layer, a buried insulation layer, and an upper substrate layer that are sequentially stacked, wherein the lower substrate layer includes the base semiconductor layer and the first lower substrate pattern, wherein the substrate further has:

a first trench passing through the upper substrate layer, the buried insulation layer, and a portion of the lower substrate layer; and a second trench passing through the upper substrate layer, the buried insulation layer, and a portion of the lower substrate layer, the second trench spaced apart from the first trench, wherein the base semiconductor layer defines bottom surfaces of the first and second trenches, wherein the first buried insulation pattern is a portion of the buried insulation layer between the first trench and the second trench, and wherein the first upper substrate pattern is a portion of the upper substrate layer between the first trench and the second trench.

12. The device according to claim 11, wherein the substrate includes a first region, a second region, a third region that are spaced apart from one another, and wherein each of the second region and the third region includes the lower substrate layer and does not include the buried insulation layer.

13. The device according to claim 9, wherein the first upper substrate pattern protrudes from the first buried insulation pattern and includes a first sub fin pattern, a second sub fin pattern, and a first connection pattern connecting the first sub fin pattern and the second sub fin pattern.

14. A semiconductor device comprising:

a lower substrate layer;

a buried insulation layer on the lower substrate layer;

a first fin pattern including a first sub fin pattern and a second sub fin pattern that protrude from the buried insulation layer and including a first connection pattern connecting the first sub fin pattern and the second sub fin pattern;

a field insulation layer covering sidewalls of the lower substrate layer, the first connection pattern and a sidewall of a portion of each of the first subs fin pattern and the second sub fin pattern; and a gate electrode crossing at least one of the first sub fin pattern and the second sub fin pattern on the field insulation layer.

15. The device according to claim 14, further comprising a first trench at a side of the first fin pattern, wherein the first trench passes through the buried insulation layer and the lower substrate layer; and wherein the field insulation layer fills the first trench.

16. The device according to claim 15, wherein the lower substrate layer and the buried insulation layer include a first region and a second region for forming transistors of different conductivity types, wherein the first fin pattern is in the first region, wherein the device further comprises a second fin pattern in the second region, wherein the second fin pattern includes a third sub fin pattern and a fourth fin pattern that protrude from the buried insulation layer and a second connection pattern connecting the third sub fin pattern and the fourth sub fin pattern, and wherein the field insulation layer covers the second connection pattern and a sidewall of a lower portion of each of the third sub fin pattern and the fourth sub fin pattern.

17. The device according to claim 14, further comprising a first epitaxial pattern filling a trench in the first sub fin pattern.

18. The device according to claim 14, wherein the lower substrate layer and the buried insulation layer include a first region and a second region, wherein the first fin pattern is in the first region, wherein the device further comprises a second fin pattern in the second region, wherein the second fin pattern protrudes from the buried insulation layer, and wherein the field insulation layer covers a sidewall of a lower portion of the second fin pattern.

19. The device according to claim 14, wherein the buried insulation layer includes an oxide of a material included in the lower substrate layer.

* * * * *